US012563790B2

(12) United States Patent　　Chia

(10) Patent No.: US 12,563,790 B2
(45) Date of Patent: Feb. 24, 2026

(54) SIDEWALL SPACER STRUCTURE TO INCREASE SWITCHING PERFORMANCE OF FERROELECTRIC MEMORY DEVICE

(71) Applicant: Taiwan Semiconductor Manufacturing Company, Ltd., Hsin-Chu (TW)

(72) Inventor: Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/493,856

(22) Filed: Oct. 25, 2023

(65) Prior Publication Data

US 2024/0055519 A1　　Feb. 15, 2024

Related U.S. Application Data

(60) Continuation of application No. 17/845,099, filed on Jun. 21, 2022, now Pat. No. 11,837,661, which is a
(Continued)

(51) Int. Cl.
*H10D 30/69*　　(2025.01)
*G11C 11/22*　　(2006.01)
(Continued)

(52) U.S. Cl.
CPC ......... *H10D 30/701* (2025.01); *G11C 11/223* (2013.01); *H01L 21/0228* (2013.01);
(Continued)

(58) Field of Classification Search
CPC .. H10D 30/701; H10D 62/115; H10D 64/021; H10D 64/033; G11C 11/223
See application file for complete search history.

(56) References Cited

U.S. PATENT DOCUMENTS 6,555,879 B1 * 4/2003 Krivokapic ....... H01L 21/28194
257/407
6,828,160 B2 * 12/2004 Liu ........................ H10B 51/30
257/E21.663
(Continued)

OTHER PUBLICATIONS

Non-Final Office Action dated Oct. 29, 2021 for U.S. Appl. No. 16/868,675.
(Continued)

*Primary Examiner* — Vincent Wall
(74) *Attorney, Agent, or Firm* — Eschweiler & Potashnik, LLC

(57) ABSTRACT

Various embodiments of the present disclosure are directed towards an integrated chip including a switching layer over a semiconductor substrate. The switching layer comprises a first metal oxide. An upper conductive structure overlies the switching layer. The switching layer is spaced between opposing sidewalls of the upper conductive structure. A first dielectric layer is disposed along opposing sidewalls of the switching layer. The first dielectric layer comprises a second metal oxide different from the first metal oxide. A top surface of the switching layer and a top surface of the first dielectric layer directly underlie a bottom surface of the upper conductive structure.

20 Claims, 17 Drawing Sheets

Related U.S. Application Data division of application No. 16/868,675, filed on May 7, 2020, now Pat. No. 11,404,569.

(60) Provisional application No. 62/948,898, filed on Dec. 17, 2019.

(51) Int. Cl.
| | |
|---|---|
| *H01L 21/02* | (2006.01) |
| *H10D 62/10* | (2025.01) |
| *H10D 64/01* | (2025.01) |
| *H10D 64/68* | (2025.01) |

(52) U.S. Cl.
CPC ......... *H10D 62/115* (2025.01); *H10D 64/021* (2025.01); *H10D 64/689* (2025.01); *H10D 64/691* (2025.01)

(56) References Cited

U.S. PATENT DOCUMENTS

| | | | | |
|---|---|---|---|---|
| 8,410,607 | B2 * | 4/2013 | Shue .................... | H10N 70/068 |
| | | | | 257/758 |
| 8,536,063 | B2 * | 9/2013 | Satoh ..................... | H10N 50/01 |
| | | | | 438/738 |
| 8,866,242 | B2 * | 10/2014 | Li .......................... | H10B 61/00 |
| | | | | 365/158 |
| 9,142,732 | B2 | 9/2015 | Luo et al. | |
| 9,142,762 | B1 * | 9/2015 | Li .......................... | H10N 50/80 |
| 10,193,065 | B2 * | 1/2019 | Dang ................... | H10N 70/063 |
| 10,879,391 | B2 * | 12/2020 | Hsieh ................. | H10D 30/0415 |
| 10,937,957 | B2 * | 3/2021 | Chuang ................. | H10N 50/10 |
| 2006/0038242 | A1 * | 2/2006 | Hsu .................... | H10D 30/6715 |
| | | | | 257/407 |
| 2008/0278867 | A1 * | 11/2008 | Fukumoto ............. | H01F 41/302 |
| | | | | 360/324.12 |
| 2009/0045453 | A1 * | 2/2009 | Heo ........................ | H10B 69/00 |
| | | | | 257/E21.679 |
| 2009/0200618 | A1 * | 8/2009 | Boescke .............. | H10D 64/666 |
| | | | | 257/E21.177 |
| 2011/0121417 | A1 * | 5/2011 | Li .......................... | H10B 61/10 |
| | | | | 716/101 |
| 2011/0156128 | A1 * | 6/2011 | Ono ................... | H01L 21/28176 |
| | | | | 257/E29.345 |
| 2013/0119494 | A1 * | 5/2013 | Li .......................... | H10N 50/10 |
| | | | | 257/E43.001 |
| 2014/0247653 | A1 * | 9/2014 | Wang ................. | G11C 11/1659 |
| | | | | 365/158 |
| 2016/0071947 | A1 * | 3/2016 | Wiatr ................. | H10D 84/0144 |
| | | | | 257/295 |
| 2016/0268271 | A1 * | 9/2016 | Mueller ................. | H10B 51/00 |
| 2018/0350932 | A1 * | 12/2018 | Liu ..................... | H10D 64/518 |
| 2019/0172999 | A1 * | 6/2019 | Chia ................... | H01F 10/3286 |
| 2020/0035909 | A1 * | 1/2020 | Sun ..................... | H10N 52/101 |
| 2020/0357927 | A1 * | 11/2020 | Hsieh ................... | H10D 30/701 |
| 2021/0183889 | A1 * | 6/2021 | Chia ................... | H10D 64/689 |
| 2021/0184043 | A1 * | 6/2021 | Chia .................... | H10D 64/021 |

OTHER PUBLICATIONS

Notice of Allowance dated Mar. 29, 2022 for U.S. Appl. No. 16/868,675.

Non-Final Office Action dated Feb. 22, 2023 for U.S. Appl. No. 17/845,099.

Notice of Allowance dated Aug. 1, 2023 for U.S. Appl. No. 17/845,099.

* cited by examiner

100

200

600

600

700

800

104

102

900

904

902

112

110

108

104

102

104

1400a

1400b

2300

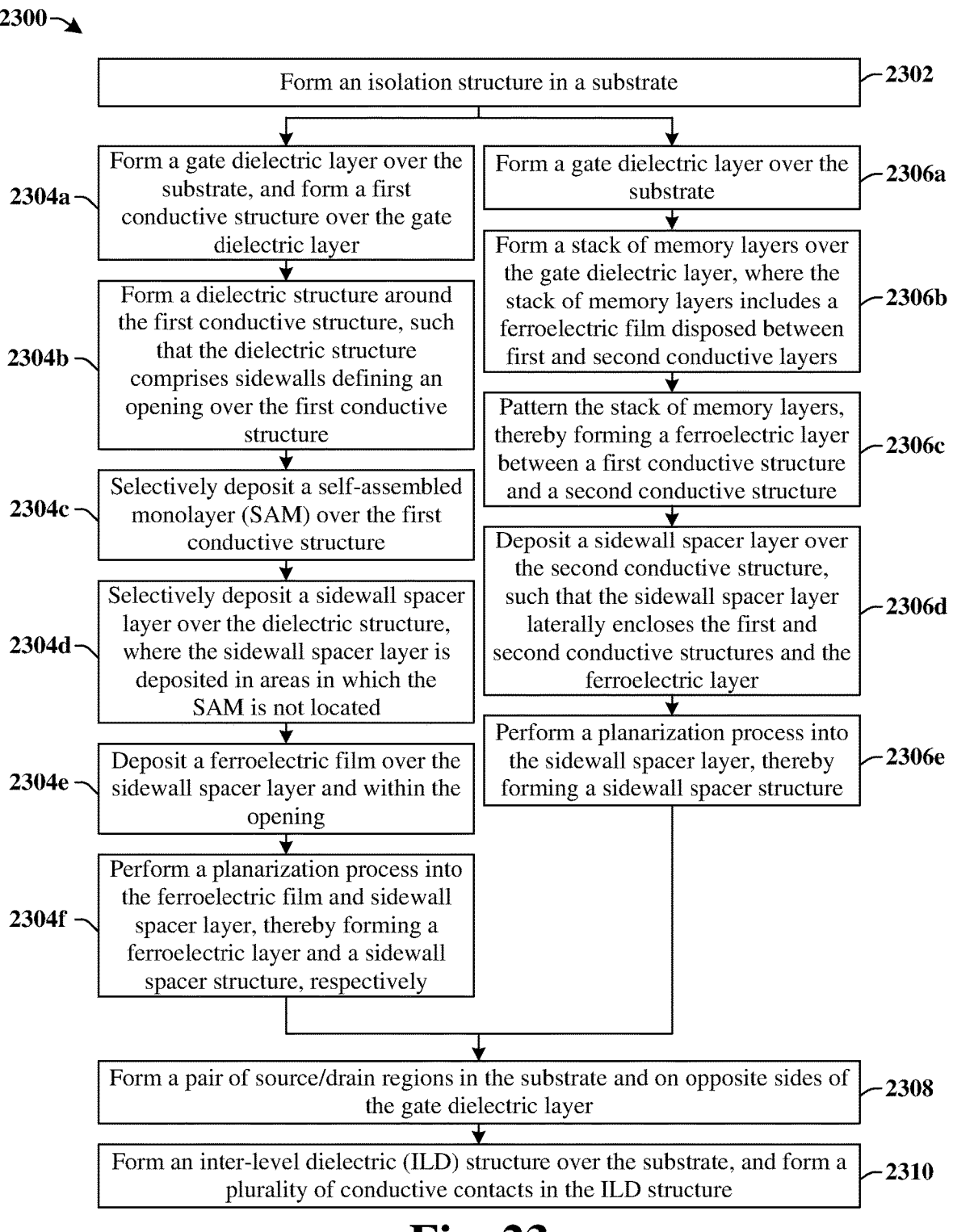

2302 — Form an isolation structure in a substrate

2304a — Form a gate dielectric layer over the substrate, and form a first conductive structure over the gate dielectric layer 2304b — Form a dielectric structure around the first conductive structure, such that the dielectric structure comprises sidewalls defining an opening over the first conductive structure 2304c — Selectively deposit a self-assembled monolayer (SAM) over the first conductive structure 2304d — Selectively deposit a sidewall spacer layer over the dielectric structure, where the sidewall spacer layer is deposited in areas in which the SAM is not located 2304e — Deposit a ferroelectric film over the sidewall spacer layer and within the opening 2304f — Perform a planarization process into the ferroelectric film and sidewall spacer layer, thereby forming a ferroelectric layer and a sidewall spacer structure, respectively 2306a — Form a gate dielectric layer over the substrate 2306b — Form a stack of memory layers over the gate dielectric layer, where the stack of memory layers includes a ferroelectric film disposed between first and second conductive layers 2306c — Pattern the stack of memory layers, thereby forming a ferroelectric layer between a first conductive structure and a second conductive structure 2306d — Deposit a sidewall spacer layer over the second conductive structure, such that the sidewall spacer layer laterally encloses the first and second conductive structures and the ferroelectric layer 2306e — Perform a planarization process into the sidewall spacer layer, thereby forming a sidewall spacer structure 2308 — Form a pair of source/drain regions in the substrate and on opposite sides of the gate dielectric layer 2310 — Form an inter-level dielectric (ILD) structure over the substrate, and form a plurality of conductive contacts in the ILD structure

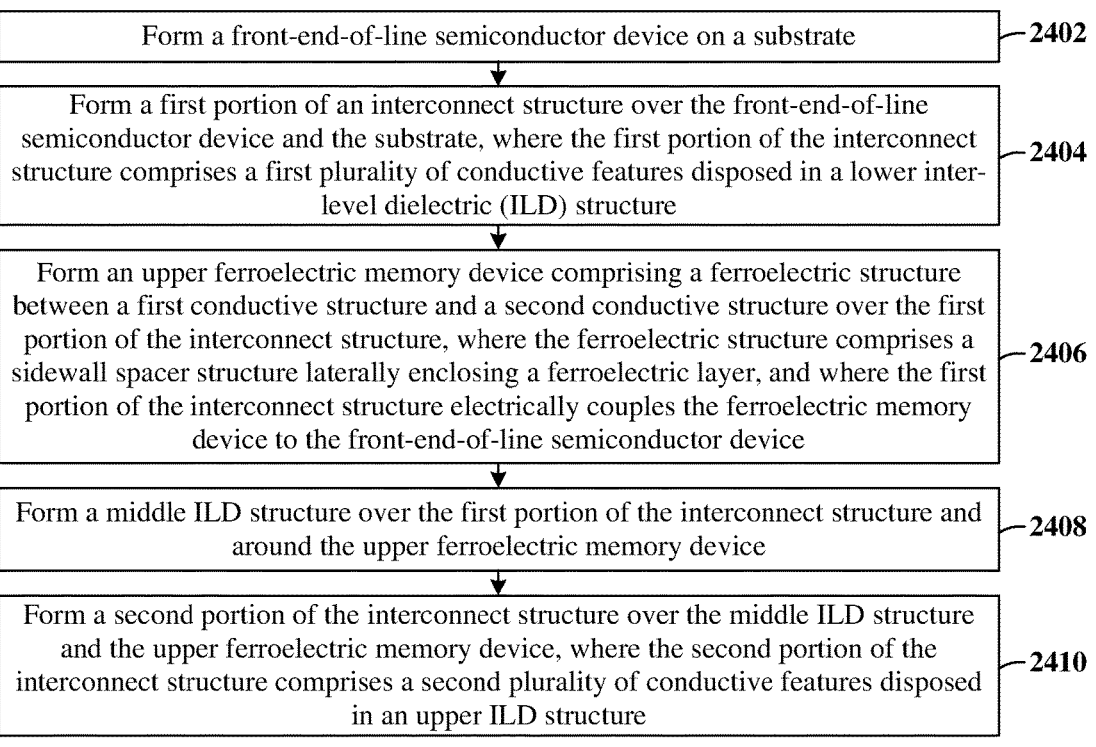

| Form a front-end-of-line semiconductor device on a substrate | 2402 |

| Form a first portion of an interconnect structure over the front-end-of-line semiconductor device and the substrate, where the first portion of the interconnect structure comprises a first plurality of conductive features disposed in a lower inter-level dielectric (ILD) structure | 2404 |

| Form an upper ferroelectric memory device comprising a ferroelectric structure between a first conductive structure and a second conductive structure over the first portion of the interconnect structure, where the ferroelectric structure comprises a sidewall spacer structure laterally enclosing a ferroelectric layer, and where the first portion of the interconnect structure electrically couples the ferroelectric memory device to the front-end-of-line semiconductor device | 2406 |

| Form a middle ILD structure over the first portion of the interconnect structure and around the upper ferroelectric memory device | 2408 |

| Form a second portion of the interconnect structure over the middle ILD structure and the upper ferroelectric memory device, where the second portion of the interconnect structure comprises a second plurality of conductive features disposed in an upper ILD structure | 2410 |

Fig. 24

SIDEWALL SPACER STRUCTURE TO INCREASE SWITCHING PERFORMANCE OF FERROELECTRIC MEMORY DEVICE

REFERENCE TO RELATED APPLICATIONS

This Application is a Continuation of U.S. application Ser. No. 17/845,099, filed on Jun. 21, 2022, which is a Divisional of U.S. application Ser. No. 16/868,675, filed on May 7, 2020 (now U.S. Pat. No. 11,404,569, issued on Aug. 2, 2022), which claims the benefit of U.S. Provisional Application No. 62/948,898, filed on Dec. 17, 2019. The contents of the above-referenced Patent Applications are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 23 illustrates a flowchart of some embodiments of a method for forming an integrated chip comprising a front-end-of-line ferroelectric memory device having a sidewall spacer structure disposed laterally around a ferroelectric layer.

FIG. 24 illustrates a flowchart of some embodiments of a method for forming an integrated chip comprising a back-end-of-line ferroelectric memory device having a sidewall spacer structure disposed laterally around a ferroelectric layer.

DETAILED DESCRIPTION

Figure 1:
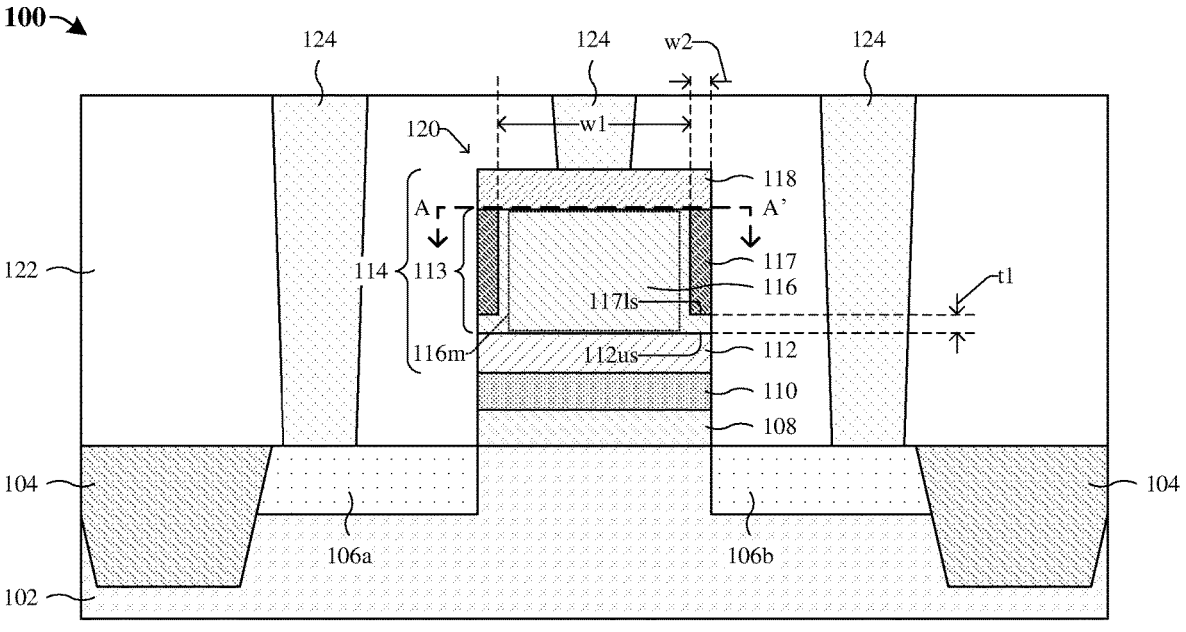
FIG. 1 illustrates a cross-sectional view of some embodiments of an integrated chip having a ferroelectric memory device with a sidewall spacer structure laterally surrounding a ferroelectric layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some ferroelectric memory (e.g., ferroelectric random-access memory (FeRAM)) comprises a ferroelectric memory cell. The ferroelectric memory cell comprises a ferroelectric structure disposed between a first electrode and a second electrode. In other embodiments, the ferroelectric structure may be disposed between a gate electrode and a semiconductor substrate (e.g., ferroelectric field-effect transistor (FeFET)). The ferroelectric structure is configured to switch between a first polarization state (e.g., negative remnant (−Pr) polarization state), which corresponds to a binary value of "1", and a second polarization state (e.g., positive remnant (+Pr) polarization state), which corresponds to a binary value of "0", or vice versa.

The ferroelectric structure includes a plurality of ferroelectric domains distributed throughout a ferroelectric material (e.g., hafnium oxide) of the ferroelectric structure. During operation of the ferroelectric memory cell, a program voltage or an erase voltage is applied between the first and second electrodes to switch the ferroelectric structure to the first polarization state or to the second polarization state, respectively. While applying the program voltage or erase voltage, a polarization of each ferroelectric domain may be orientated in a same manner. As the plurality of ferroelectric domains are set to a same polarization state, the ferroelectric structure will have a polarization state that corresponds to the overall polarity of the plurality of the ferroelectric domains.

In a memory array including a plurality of the ferroelectric memory cells, there may be a variation in program and erase voltages between adjacent ferroelectric memory cells, thereby resulting in non-uniformity across the memory array. This variation in program and erase voltages may be due to, for example, a difference in switching speeds of the ferroelectric domains across each ferroelectric structure. Further, the difference in switching speeds of the ferroelectric domains may also result in a switching window (i.e., the difference between the program and erase voltages) that is small for each ferroelectric structure, thereby resulting in difficulty of reliably reading the data state of each ferroelectric memory cell. One way to increase this switching speed is to promote nucleation of ferroelectric domains during the switching process. In some embodiments, it has been observed that embedding, for example, aluminum nanoclusters within the ferroelectric material increases a switching performance of the ferroelectric memory cell, thereby increasing uniformity of the program and erase voltages across the memory array. This is because the aluminum nanoclusters may assist in nucleation of the ferroelectric domains under the presence of the program voltage or erase voltage, thereby increasing a switching speed of the ferroelectric domains across the ferroelectric structures. However, the aluminum nanoclusters are generally placed in a middle region of the ferroelectric structure, thereby causing a loss in orthorhombic phase across the ferroelectric structure. This is because the aluminum nanoclusters may act as inhibitors for the ferroelectric structure forming the orthorhombic phase, where the orthorhombic phase ensures the ferroelectric structure has ferroelectric properties such that it may switch between the first and second polarization states. Thus, the aluminum nanoclusters being placed in the middle region of the ferroelectric structure reduces a switching speed and an overall performance of the ferroelectric memory cell, thereby reducing a performance of the memory array.

Accordingly, various embodiments of the present disclosure relate to a ferroelectric memory cell having a ferroelectric structure with a sidewall spacer structure laterally enclosing a ferroelectric layer. In some embodiments, the ferroelectric memory device includes a first electrode, a second electrode, and a ferroelectric structure disposed between the first and second electrodes. The ferroelectric structure includes a ferroelectric layer and a sidewall spacer structure that laterally encloses the ferroelectric layer. The sidewall spacer structure comprises a material (e.g., aluminum oxide) configured to enhance nucleation of ferroelectric domains within the ferroelectric layer, thereby increasing a switching performance of the ferroelectric structure. Further, by virtue of the sidewalls spacer structure being disposed along sidewalls of the ferroelectric layer (i.e., laterally offset from a middle region of the ferroelectric layer), a loss in orthorhombic phase may be mitigated. Thus, the sidewall spacer structure may increase switching speeds of the ferroelectric domains while mitigating loss of orthorhombic phase, thereby increasing the switching window and/or overall performance of the ferroelectric memory cell. Further, in a memory array comprising a plurality of the ferroelectric memory cells, the sidewall spacer structure decreases a variation in program and erase voltages between adjacent ferroelectric memory cells, thereby increasing a performance of the memory array.

FIG. 1 illustrates a cross-sectional view of some embodiments of an integrated chip 100 including a ferroelectric memory device 114 with a ferroelectric structure 113, where the ferroelectric structure 113 includes a ferroelectric layer 116 and a sidewall spacer structure 117. In some embodiments, the ferroelectric memory device 114 may be part of a random-access memory (RAM) device (e.g., ferroelectric random-access memory (FeRAM) device) and/or could be realized in a fin type design (e.g., finFET type design). Further, the ferroelectric memory device 114 may be referred to as a front-end-of-line ferroelectric memory device.

The integrated chip 100 includes an inter-level dielectric (ILD) structure 122 overlying a substrate 102. An isolation structure 104 is disposed within the substrate 102. A pair of source/drain regions 106a-b are disposed in the substrate 102 and are spaced apart. A device gate stack 120 overlies the substrate 102 and is spaced between the source/drain regions 106a-b. A plurality of conductive contacts 124 are disposed in the ILD structure 122. The conductive contacts 124 extend through the ILD structure 122 to contact the source/drain regions 106a-b and the device gate stack 120, respectively.

In some embodiments, the device gate stack 120 comprises a gate dielectric layer 108 disposed along the substrate 102. A gate electrode 110 overlies the gate dielectric layer 108. The ferroelectric memory device 114 overlies the gate electrode 110. In addition, in some embodiments, the ferroelectric memory device 114 comprises a first conductive structure 112, a second conductive structure 118, and the ferroelectric structure 113 disposed between the first and second conductive structures 112, 118. In some embodiments, the ferroelectric memory device 114 may be referred to as a polarization switching structure. Further, the ferroelectric memory device 114 is configured to store a bit of data. For example, the ferroelectric memory device 114 may switch between a first polarization state (e.g., negative remnant (−Pr) polarization state), which corresponds to a binary value of "1", and a second polarization state (e.g., positive remnant (+Pr) polarization state), which corresponds to a binary value of "0", or vice versa. In some embodiments, a positive voltage pulse is applied to the second conductive structure 118 to switch to the first polarization states, and a negative voltage pulse is applied to the second conductive structure 118 to switch to the second polarization state, or vice versa. In various embodiments, the positive voltage pulse may be referred to as a program voltage, and the negative voltage pulse may be referred to as an erase voltage, or vice versa. In some embodiments, the first and second conductive structures 112, 118 may, for example, respectively be or comprise tungsten, ruthenium, titanium nitride, tantalum nitride, another suitable conductive material, or any combination of the foregoing.

In further embodiments, the ferroelectric layer 116 may, for example, be or comprise a metal-oxide (e.g., hafnium oxide ($Hf_XO_Y$)), a component-metal-oxide (e.g., hafnium-silicon-oxide ($Hf_XSi_YO_Z$), hafnium-aluminum-oxide ($Hf_X$-$Al_YO_Z$), hafnium-gadolinium-oxide ($Hf_XGd_YO_Z$), hafnium-zirconium-oxide ($Hf_XZr_YO_Z$), hafnium-lanthanum-oxide ($Hf_XLa_YO_Z$), hafnium-strontium-oxide ($Hf_XSr_YO_Z$), hafnium-yttrium-oxide ($Hf_XY_YO_Z$), etc.), a metal-oxynitride (e.g., hafnium oxynitride ($Hf_XO_YN_Z$)), another suitable material, or any combination of the foregoing. In yet further embodiments, the sidewall spacer structure 117 may, for example, be or comprise aluminum oxide, gallium oxide, indium oxide, another metal oxide, another suitable material, or any combination of the foregoing. In some embodiments, the sidewall spacer structure 117 may be referred to as a nucleation enhancement structure or a switching enhancement structure.

By virtue of the sidewall spacer structure 117 comprising a metal oxide (e.g., aluminum oxide), with a switching enhancement element (e.g., aluminum), it may assist in nucleation of ferroelectric domains while applying the program voltage or erase voltage. This may increase a switching speed of the ferroelectric domains across the ferroelectric layer 116, thereby increasing a switching performance of the ferroelectric memory device 114. For example, the increased switching performance may include increasing the switching window (i.e., the difference between the program and erase voltages) of the ferroelectric memory device 114, thereby increasing a reliability of reading the ferroelectric memory device 114. Further, the ferroelectric memory device 114 may be disposed within a memory array (not shown) comprising a plurality of rows and columns of individual ferroelectric memory devices 114. By virtue of the sidewall spacer structure 117 assisting in nucleation of ferroelectric domains within the ferroelectric layer 116, a variation in program and erase voltages between adjacent ferroelectric memory cells within the memory array is decreased, thereby increasing a performance of the memory array.

In addition, because the sidewall spacer structure 117 is disposed along sidewalls of the ferroelectric layer 116, a loss in orthorhombic phase across the ferroelectric layer 116 may be mitigated, thereby further increasing the switching performance of the ferroelectric memory device 114. This, for example, is because the switching enhancement element (e.g., aluminum) is laterally offset from a middle region 116*m* of the ferroelectric layer 116.

In some embodiments, the gate dielectric layer 108 may, for example, be or comprise an oxide (e.g., silicon dioxide), a high-k dielectric material (e.g., $HfO_2$, $ZrO_2$, or some other dielectric material with a dielectric constant greater than about 3.9), some other dielectric material, or any combination of the foregoing. In various embodiments, the ferroelectric layer 116 may comprise a first material (e.g., hafnium oxide (e.g., $HfO_2$)) with a first dielectric constant (e.g., within a range of about 16 to 19), and the sidewall spacer structure 117 may comprise a second material (e.g., aluminum oxide ($Al_2O_3$)) with a second dielectric constant (e.g., within a range of about 8 to 9)). Thus, the first dielectric constant may be greater than the second dielectric constant. Further, in some embodiments, the ILD structure 122 may, for example, be or comprise a low-k dielectric (e.g., a dielectric material with a dielectric constant less than about 3.9), an oxide (e.g., silicon dioxide (e.g., $SiO_2$)), another suitable dielectric material, or any combination of the foregoing. In further embodiments, the ILD structure 122 comprises a third material (e.g., silicon dioxide (e.g., $SiO_2$)) with a third dielectric constant (e.g., about 3.9). Therefore, in some embodiments, the first dielectric constant may be greater than the second dielectric constant, and the third dielectric constant may be less than the second dielectric constant.

In some embodiments, a region of the ferroelectric layer 116 disposed laterally between opposing sidewalls of the sidewall spacer structure 117 has a first width w1 and the sidewall spacer structure 117 has a second width w2 that is less than the first width w1. In some embodiments, the first width w1 is within a range of about 20 to 150 nanometers (nm) or another suitable value. In further embodiments, the second width w2 is within a range of about 0.2 to 100 Angstroms or another suitable value. In yet further embodiments, a ratio between the first width w1 and the second width w2 (i.e., w1:w2) is within a range of about 5:1 to 30:1 or another suitable value. In some embodiments, if the first width w1 is greater than about 150 nm and/or the second width w2 is greater than about 100 Angstroms, then a number of ferroelectric memory devices 114 that may be disposed over the substrate 102 may be decreased. In further embodiments, if the first width w1 is less than about 20 nm and/or the second width w2 is less than about 0.2 Angstroms, then a reliability and/or endurance of the ferroelectric memory device 114 may be reduced.

A first thickness t1 of the ferroelectric layer 116 is defined between a lower surface 117*ls* of the sidewall spacer structure 117 and an upper surface 112*us* of the first conductive structure 112. In some embodiments, the first thickness t1 is within a range of about 1 to 10 millimeters (mm), less than about 10 mm, or another suitable thickness value. In further embodiments, if the first thickness t1 is substantially thick (e.g., greater than about 10 mm), then a minimum thickness of the ferroelectric layer 116 would be increased in order to ensure that the sidewall spacer structure 117 may assist in nucleation of ferroelectric domains within the ferroelectric layer 116. This, in part, may require applying a greater voltage value across the ferroelectric layer 116 to induce switching within the ferroelectric layer 116, thereby increasing a power consumption and decreasing an overall performance of the ferroelectric memory device 114.

Figure 2:
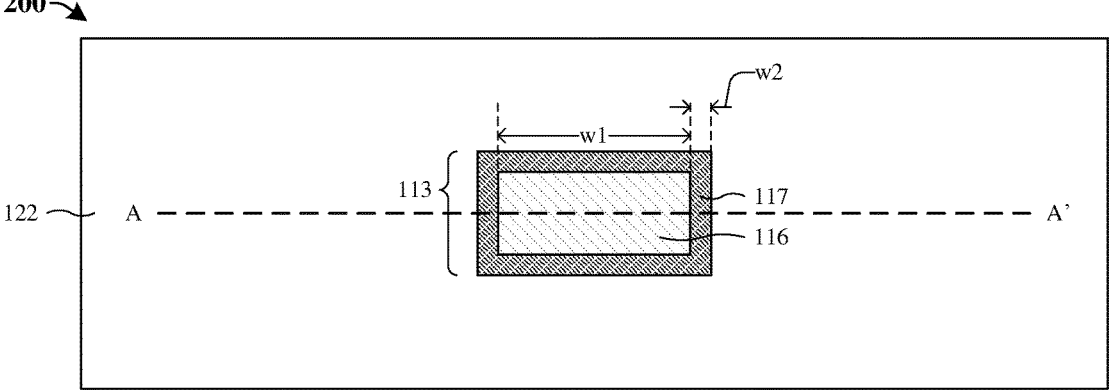
FIG. 2 illustrates a top view of some alternative embodiments of the integrated chip of FIG. 1 according to the line A-A'.

FIG. 2 illustrates a top view 200 of some alternative embodiments of the integrated chip 100 of FIG. 1 taken along line A-A'.

As illustrated in the top view 200 of FIG. 2 the sidewall spacer structure 117 continuously laterally wraps around the ferroelectric layer 116. In some embodiments, when viewed from above, the ferroelectric layer 116 may, for example, be rectangular, square, circular, or another suitable shape.

Figure 3:
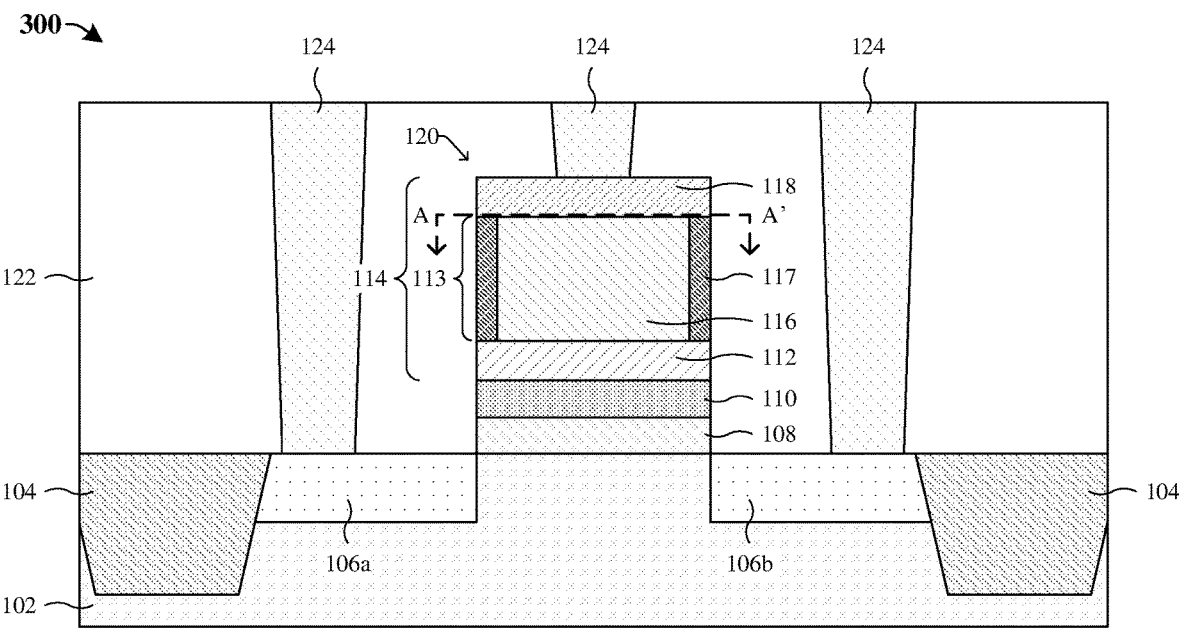
FIGS. 3 through 6A-6D illustrate cross-sectional views of some alternative embodiments of the integrated chip of FIG. 1.

FIG. 3 illustrates a cross-sectional view of some embodiments of an integrated chip 300 according to some alternative embodiments of the integrated chip 100 of FIG. 1, in which the sidewall spacer structure 117 continuously extends from a top surface of the first conductive structure 112 to a bottom surface of the second conductive structure 118.

Figure 4:
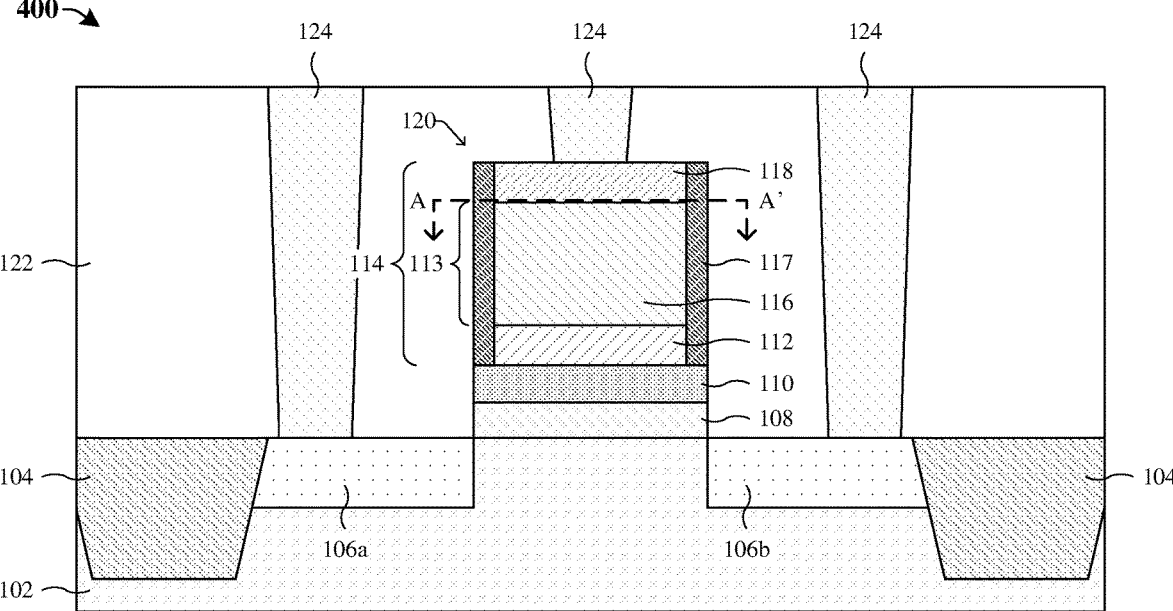

FIG. 4 illustrates a cross-sectional view of some embodiments of an integrated chip 400 according to some alternative embodiments of the integrated chip 300 of FIG. 3, in which the sidewall spacer structure 117 laterally encloses the ferroelectric layer, the first conductive structure 112, and the second conductive structure 118, respectively. Thus, a bottom surface of the sidewall spacer structure 117 may be aligned with a bottom surface of the first conductive structure 112, and a top surface of the sidewall spacer structure 117 may be aligned with a top surface of the second conductive structure 118.

In further embodiments, the top view 200 of FIG. 2 may represent some alternative embodiments of the integrated chip 300 taken along the line A-A' of FIG. 3, or some alternative embodiments of the integrated chip 400 taken along the line A-A' of FIG. 4. Thus, in various embodiments, the sidewall spacer structure 117 continuously laterally extends around an outer perimeter of the ferroelectric layer 116.

Figures 5A, 5B:
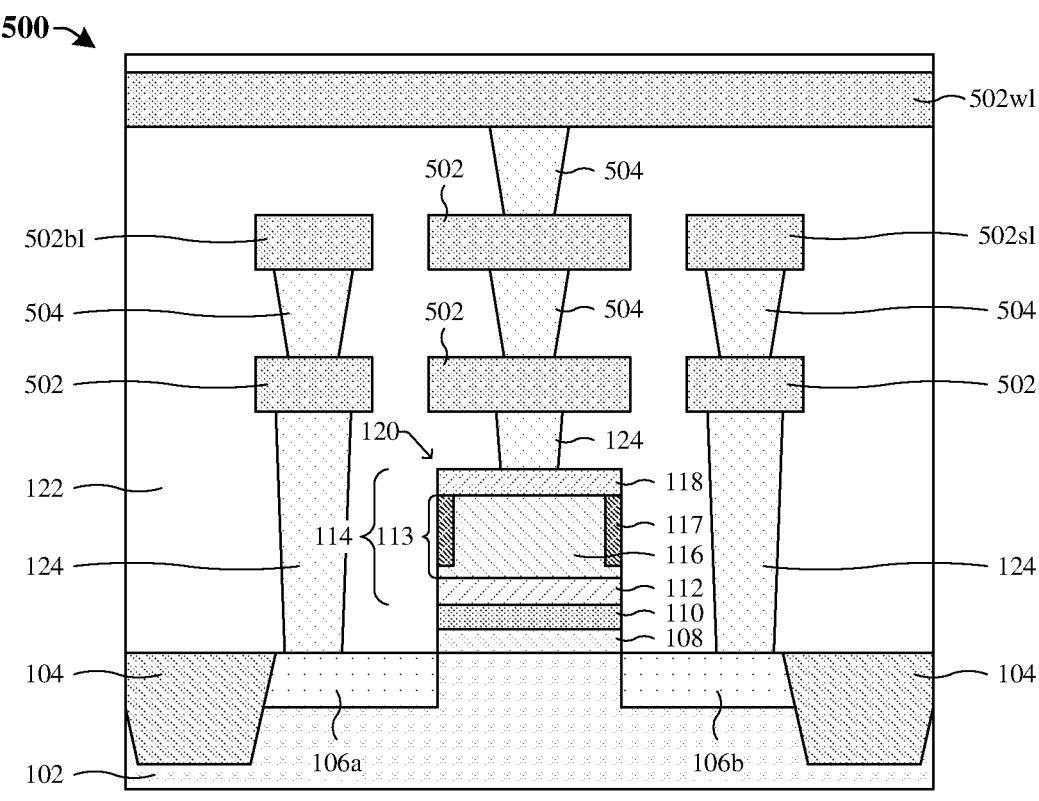

FIG. 5A illustrates a cross-sectional view of some embodiments of an integrated chip 500 according to some alternative embodiments of the integrated chip 100 of FIG. 1.

As shown in FIG. 5A, a plurality of conductive lines 502 (e.g., metal lines) and a plurality of conductive vias 504 (e.g., metal vias) are disposed in the ILD structure 122. The plurality of conductive lines 502, the plurality of conductive vias 504, and the plurality of conductive contacts 124 are electrically coupled together in a predefined manner and configured to provide electrical connections between various devices disposed throughout the integrated chip 500. In some embodiments, the plurality of conductive lines 502 and the plurality of conductive vias 504 may, for example, be or comprise copper, aluminum, titanium nitride, tantalum nitride, ruthenium, tungsten, another conductive material, or any combination of the foregoing. In further embodiments, the conductive contacts 124 may, for example, be or comprise tungsten, copper, aluminum, ruthenium, another conductive material, or any combination of the foregoing. It will be appreciated that any number of conductive lines 502 and/or conductive vias 504 may be alternately stacked over one another in the ILD structure 122. In yet further embodiments, the plurality of conductive contacts 124, the plurality of conductive lines 502, the plurality of conductive vias 504, and the ILD structure 122 may be referred to as an interconnect structure.

A first one of the plurality of conductive lines 502 is denoted as 502wl and may be referred to as a word line. In some embodiments, the word line 502wl may be electrically coupled to the ferroelectric structure 113 via the interconnect structure and the second conductive structure 118. A second one of the plurality of conductive lines 502 is denoted as 502bl and may be referred to as a bit line. In further embodiments, the bit line 502bl may be electrically coupled to a first source/drain region 106a of the source/drain regions 106a-b via the interconnect structure. A third one of the plurality of conductive lines 502 is denoted as 502sl and may be referred to as a source line. In yet further embodiments, the source line 502sl1 may be electrically coupled to a second source/drain region 106b of the source/drain regions 106a-b via the interconnect structure.

In some embodiments, by providing suitable bias conditions (e.g., a positive voltage pulse, a negative voltage pulse, etc.) to the word line 502wl, the bit line 502bl, and/or the source line 502sl1, the ferroelectric structure 113 can be switched between two data states. In some embodiments, the ferroelectric memory device 114, the gate electrode 110, the gate dielectric layer 108, and the source/drain regions 106a-b may be configured as a metal-ferroelectric-metal-insulator-semiconductor field-effect transistor (MFMIS-FET) device.

In some embodiments, the substrate 102 may comprise any type of semiconductor body (e.g., monocrystalline silicon/CMOS bulk, silicon-germanium (SiGe), silicon on insulator (SOI), etc.). The isolation structure 104 may, for example, be a shallow trench isolation (STI) structure, a deep trench isolation (DTI) structure, another suitable isolation structure, or the like. In further embodiments, the source/drain regions 106a-b are doped regions of the substrate 102 that have a doping type (e.g., n-type or p-type) opposite that of adjoining regions of the substrate 102, or the adjoining regions of the substrate 102 may be intrinsic. The ILD structure 122 may comprise one or more stacked ILD layers, which may respectively comprise a low-k dielectric (e.g., a dielectric material with a dielectric constant less than about 3.9), an oxide (e.g., silicon dioxide), another suitable dielectric material, or any combination of the foregoing.

FIG. 5B illustrates a cross-sectional view of some alternative embodiments of the integrated chip 500 of FIG. 5A, where the sidewall spacer structure 117 continuously extends from sidewalls of the gate dielectric layer 108 to sidewalls of the second conductive structure 118.

FIGS. 6A-6D illustrate cross-sectional views of some embodiments of an integrated chip 600 corresponding to some alternative embodiments of the integrated chip 500 of FIGS. 5A-5B, in which the first and second conductive structures 112, 118 are omitted. Further, the ferroelectric structure 113 is disposed between the gate electrode 110 and the gate dielectric layer 108. In such embodiments, the gate electrode 110, the ferroelectric structure 113, the gate dielectric layer 108, and the source/drain regions 106a-b may be configured as a metal-ferroelectric-insulator-semiconductor field-effect transistor (MFIS-FET or FeFET). In further embodiments, the ferroelectric layer 116 directly contacts the gate electrode 110 and the gate dielectric layer 108.

Figure 6A:
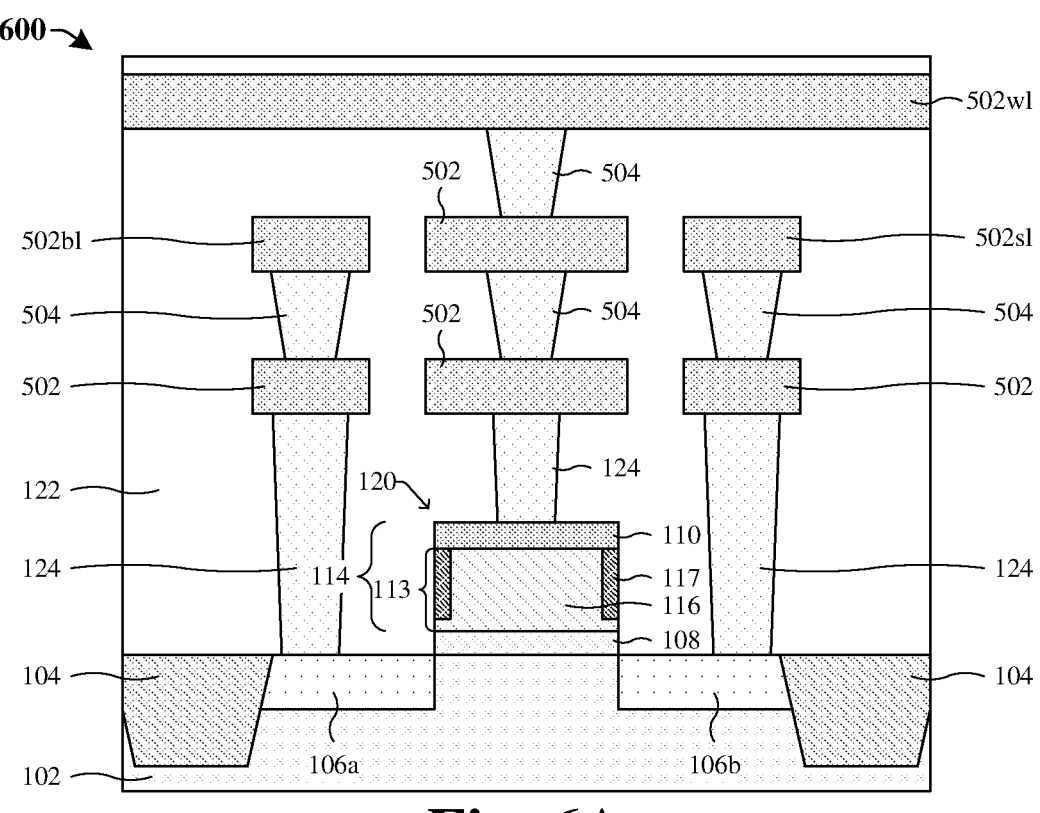
Figure 6B:
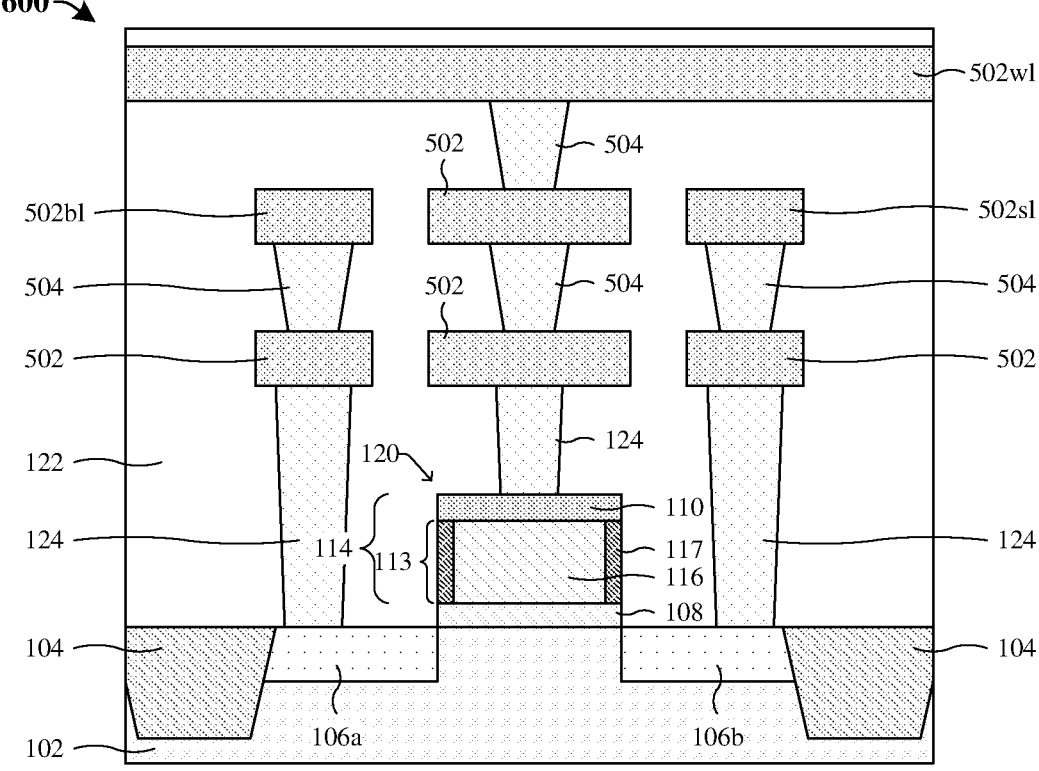
Figure 6C:
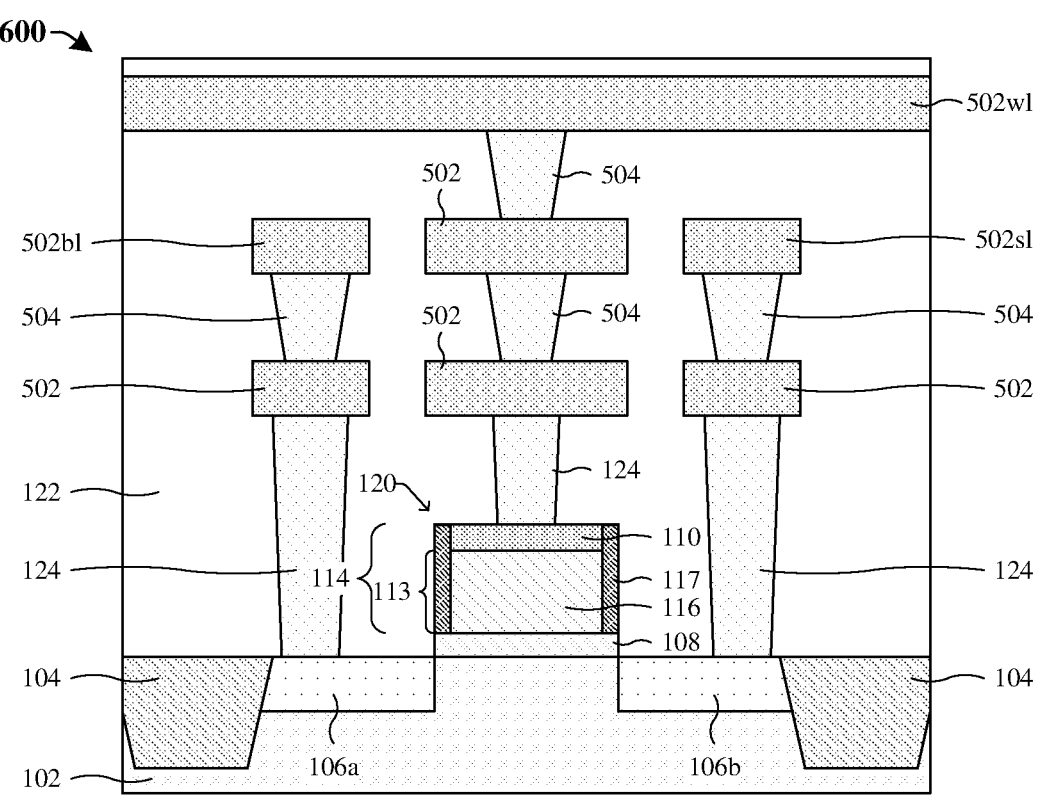
Figure 6D:
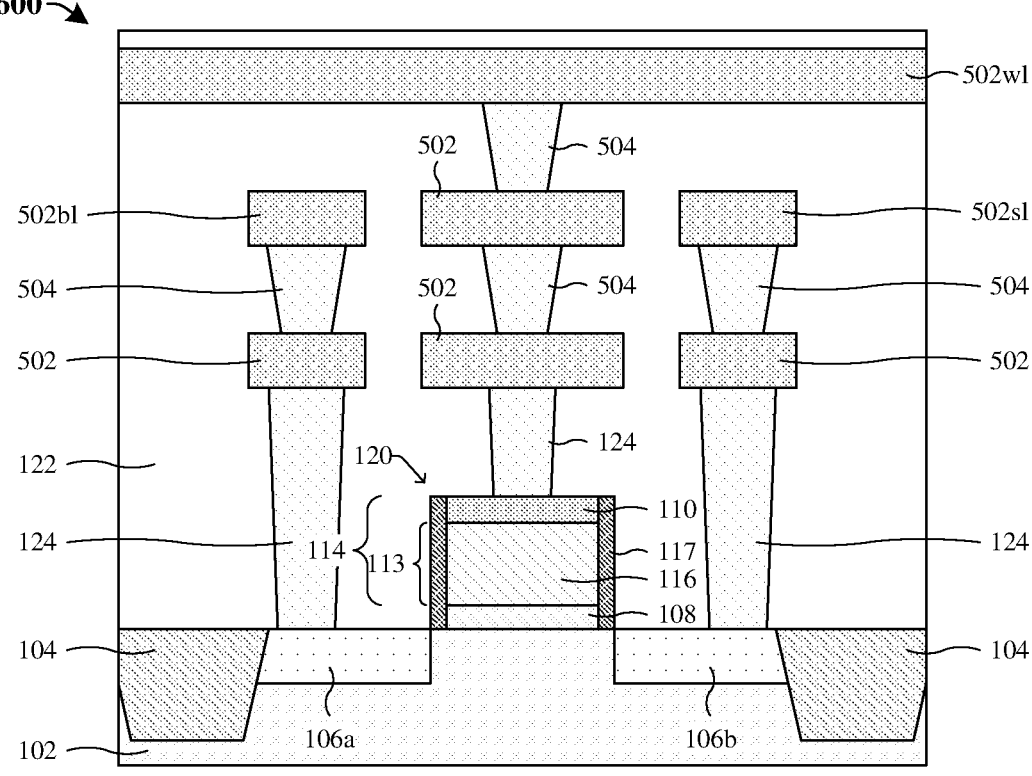

As illustrated by the cross-sectional view of FIG. 6A, the sidewall spacer structure 117 extends from a top surface of the ferroelectric layer 116 to a point above a bottom surface of the ferroelectric layer 116. As illustrated by the cross-sectional view of FIG. 6B, a top surface of the sidewall spacer structure 117 is aligned with a top surface of the ferroelectric layer 116 and a bottom surface of the sidewall spacer structure 117 is aligned with a bottom surface of the ferroelectric layer 116. As illustrated by the cross-sectional view of FIG. 6C, a bottom surface of the sidewall spacer structure 117 is aligned with a bottom surface of the ferroelectric layer 116 and a top surface of the sidewall spacer structure 117 is aligned with a top surface of the gate electrode 110. As illustrated by the cross-sectional view of FIG. 6D, a bottom surface of the sidewall spacer structure 117 is aligned with a bottom surface of the gate dielectric layer 108 and a top surface of the sidewall spacer structure 117 is aligned with a top surface of the gate electrode 110.

Figure 7A:
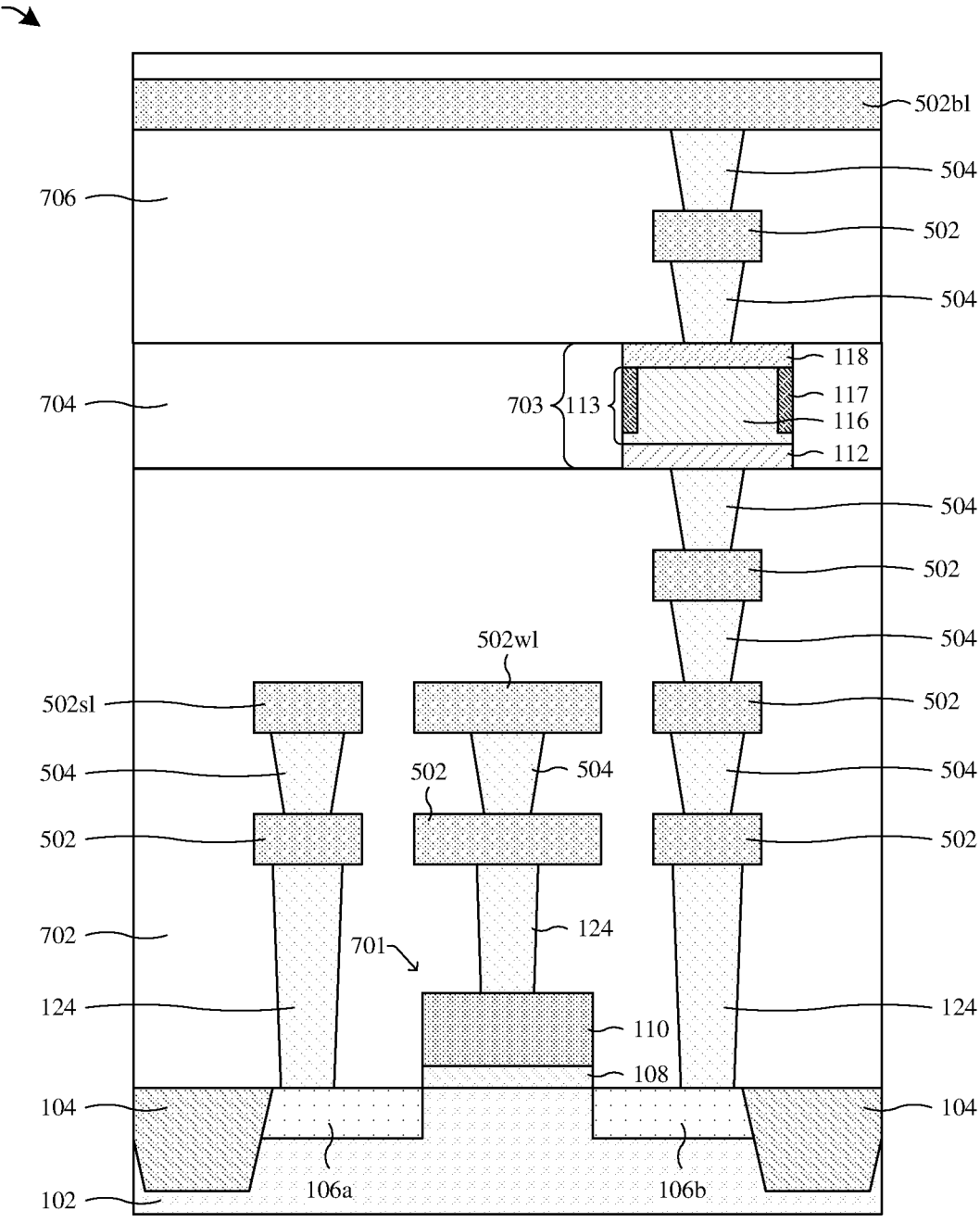
FIGS. 7A and 7B illustrate cross-sectional views of some embodiments of an integrated chip having a ferroelectric memory device with a sidewall spacer structure laterally surrounding a ferroelectric layer.
Figure 7B:
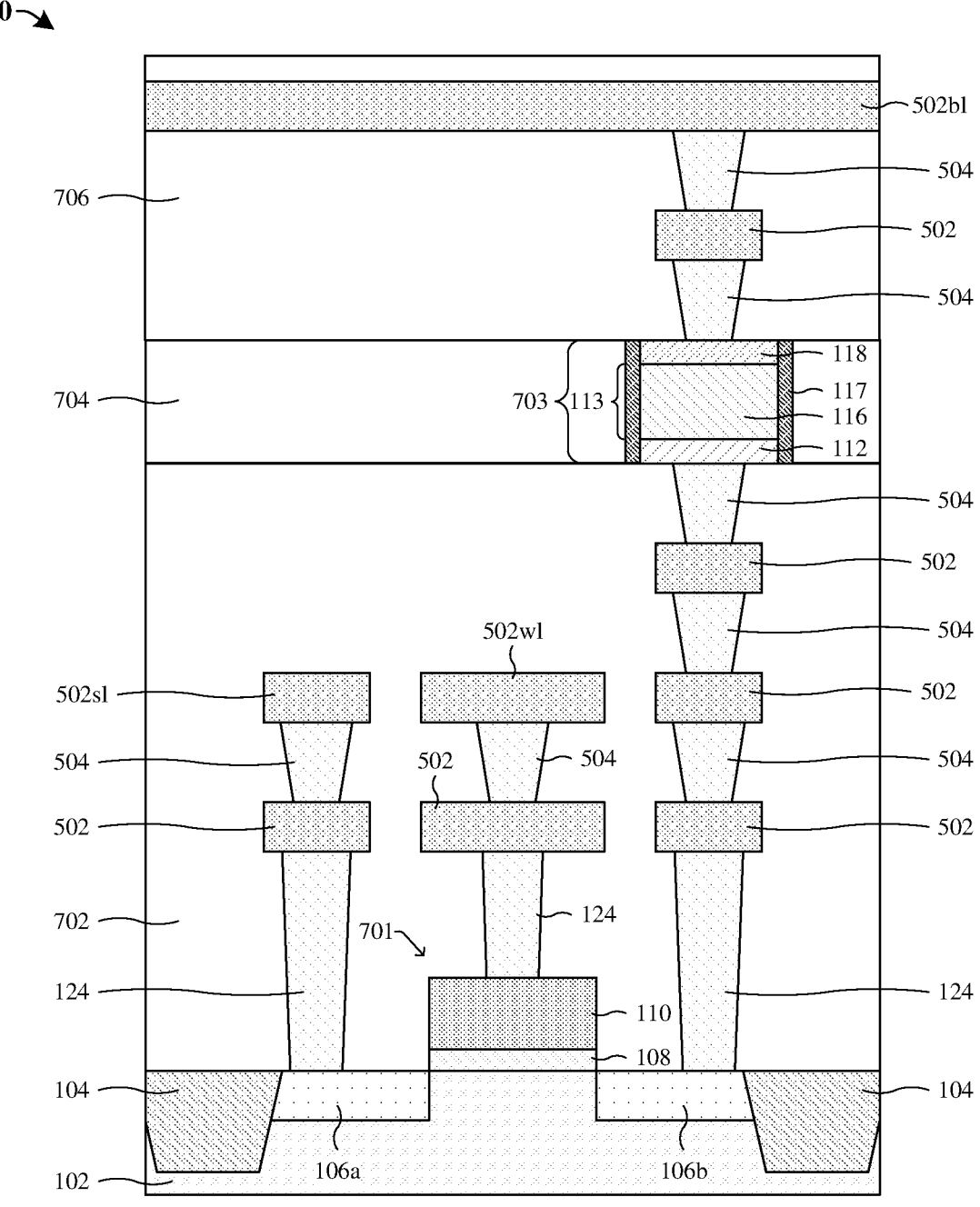

FIGS. 7A-7B illustrate cross-sectional views of some embodiments of an integrated chip 700 having an upper ferroelectric memory device 703 with a ferroelectric structure 113 that includes a sidewall spacer structure 117 laterally enclosing a ferroelectric layer 116. In some embodiments, the upper ferroelectric memory device 703 may be referred to as a back-end-of-line ferroelectric memory device. In further embodiments, the upper ferroelectric memory device 703 may be part of a RAM device (e.g., FeRAM device). It will be appreciated that, in some embodiments, features of the integrated chip 700 that share a reference number with features of the integrated chip 500 of FIG. 5A may have substantially similar properties (e.g., dimensions, chemical compositions, relationships, etc.) as the features of the integrated chip 500 of FIG. 5A in which they share a reference number. It will further be appreciated that, in some embodiments, the integrated chip 500 may comprise a plurality of the upper ferroelectric memory device 703 disposed in a memory array. In some embodiments, the upper ferroelectric memory device 703 may be referred to as a polarization switching structure.

The integrated chip 700 includes a semiconductor device 701 disposed on the substrate 102. In some embodiments, the semiconductor device 701 may be a metal-oxide semiconductor field-effect transistor (MOSFET), a bipolar junction transistor (BJT), a high-electric-mobility transistor (HEMT), or any other front-end-of-line semiconductor device. In further embodiments, the semiconductor device 701 may comprise a gate dielectric layer 108, a gate electrode 110 overlying the gate dielectric layer 108, and a pair of source/drain regions 106a-b.

A lower ILD structure 702 overlies the substrate 102 and the semiconductor device 701. In some embodiments, a plurality of conductive contacts 124, a plurality of conductive lines 502, and a plurality of conductive vias 504 are disposed in the lower ILD structure 702. An upper ILD structure 706 overlies the lower ILD structure 702. In further embodiments, the conductive lines 502 and the conductive vias 504 are disposed within the upper ILD structure 706. A middle ILD structure 704 is disposed between the upper ILD structure 706 and the lower ILD structure 702. In yet further embodiments, the lower ILD structure 702, the middle ILD structure 704, and the upper ILD structure 706 may comprise one or more stacked ILD layers, which may respectively comprise a low-k dielectric (e.g., a dielectric material with a dielectric constant less than about 3.9), an oxide (e.g., silicon dioxide), another suitable dielectric material, or the like.

In some embodiments, the upper ferroelectric memory device 703 is disposed in the middle ILD structure 704. The upper ferroelectric memory device 703 includes a first conductive structure 112, a second conductive structure 118, and a ferroelectric structure 113 disposed between the first and second conductive structures 112, 118. Further, in some embodiments, the ferroelectric structure 113 comprises a sidewall spacer structure 117 and a ferroelectric layer 116. In some embodiments, an upper surface of the second conductive structure 118 is substantially co-planar with an upper surface of the middle ILD structure 704. In further embodiments, a lower surface of the first conductive structure 112 is substantially co-planar with a lower surface of the middle ILD structure 704.

In some embodiments, the ferroelectric structure 113 is electrically coupled to the second source/drain region 106b of the semiconductor device 701 via the plurality of conductive lines 502, the plurality of conductive vias 504, and the plurality of conductive contacts 124 disposed in the lower ILD structure 702. Thus, in some embodiments, application of a suitable word line (WL) voltage to the word line 502wl may electrically couple the upper ferroelectric memory device 703 between the bit line 502bl and the source line 502sl. Consequently, by providing suitable bias conditions (e.g., a positive voltage pulse, a negative voltage pulse, etc.) the ferroelectric structure 113 can be switched between two data states.

In some embodiments, the upper ferroelectric memory device 703, the semiconductor device 701, and electrical interconnections between the upper ferroelectric memory device 703 and the semiconductor device 701 define a first one-transistor one-capacitor (1T1C) FeRAM memory cell. Note that the electrical interconnects between the upper ferroelectric memory device 703 and the semiconductor device 701 are defined by the conductive lines 502, conductive vias 504, and the conductive contacts 124. In such embodiments, the upper ferroelectric memory device 703 is configured as a capacitor configured to store varying levels of charge which correspond to an individual bit of data stored in the capacitor, and the semiconductor device 701 facilitates access to the upper ferroelectric memory device 703 for read and write operations. In some embodiments, the first 1T1C FeRAM memory cell is one of many 1T1C FeRAM memory cells arranged in rows and columns to define a memory array. In such embodiments, the sidewall spacer structure 117 increases switching speeds of the ferroelectric domains in the ferroelectric layer 116 thereby increasing a performance of the memory array.

As illustrated by the cross-sectional view of FIG. 7A, the sidewall spacer structure 117 extends from a top surface of the ferroelectric layer 116 to a point above a bottom surface of the ferroelectric layer 116. Further, as illustrated by the cross-sectional view 7B, a bottom surface of the sidewall spacer structure 117 is aligned with a bottom surface of the first conductive structure 112 and a top surface of the sidewall spacer structure 117 is aligned with a top surface of the second conductive structure 118. In further embodiments, the sidewall spacer structure 117 may be configured as the sidewall spacer structure of the integrated chip 300 of FIG. 3. In such embodiments, a top surface of the sidewall spacer structure 117 is aligned with a top surface of the ferroelectric layer 116, and a bottom surface of the sidewall spacer structure 117 is aligned with a bottom surface of the ferroelectric layer 116 (not shown).

FIGS. 8-16 illustrate various views 800-1600 of some embodiments of a first method of forming an integrated chip having a ferroelectric memory device with a sidewall spacer structure laterally surrounding a ferroelectric layer according to aspects of the present disclosure. Although the various views 800-1600 shown in FIGS. 8-16 are described with reference to a first method, it will be appreciated that the structures shown in FIGS. 8-16 are not limited to the first method but rather may stand alone separate of the first method. Furthermore, although FIGS. 8-16 are described as a series of acts, it will be appreciated that these acts are not limiting in that the order of the acts can be altered in other embodiments, some acts that are illustrated and/or described may be omitted in whole or in part.

Figure 8:
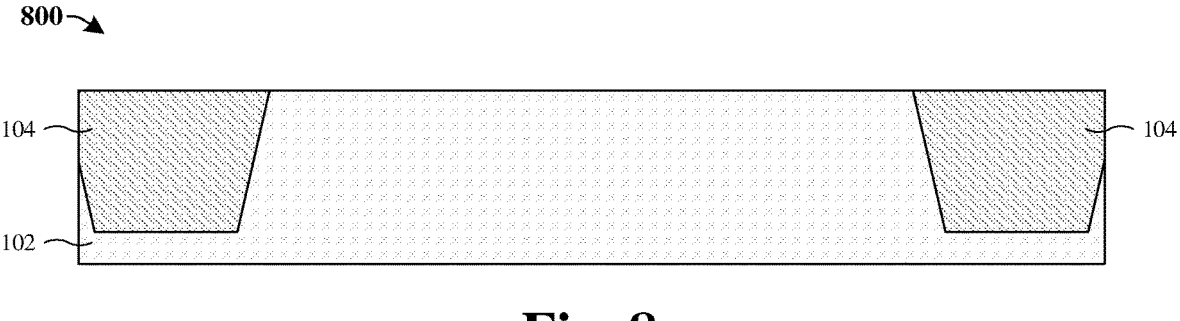
FIGS. 8-16 illustrate a series of various views of some embodiments of a first method for forming an integrated chip having a ferroelectric memory device with a sidewall spacer structure laterally enclosing a ferroelectric layer.

As illustrated in the cross-sectional view 800 of FIG. 8, an isolation structure 104 is formed within a substrate 102. In some embodiments, the isolation structure 104 may be formed by selectively etching the substrate 102 to form a trench in the substrate 102, and subsequently filing (e.g., by chemical vapor deposition (CVD), physical vapor deposition (PVD), atomic layer deposition (ALD), or another suitable deposition or growth process) the trench with a dielectric material. In further embodiments, the substrate 102 is selectively etched by forming a masking layer (not shown) over the substrate 102, and subsequently exposing the substrate 102 to one or more etchants configured to selectively remove unmasked portions of the substrate 102. In yet further embodiments, the dielectric material may, for example, be or comprise an oxide (e.g., silicon dioxide), a nitride (e.g., silicon nitride), a carbide (e.g., silicon carbide), another suitable dielectric material, or any combination of the foregoing.

Figure 9:
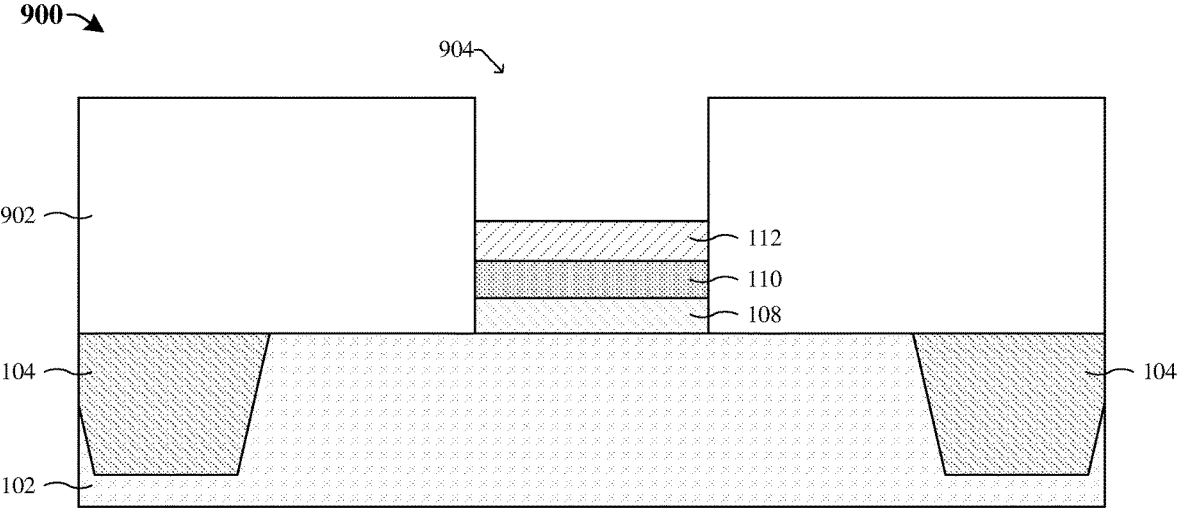

As illustrated in the cross-sectional view 900 of FIG. 9, a gate dielectric layer 108, a gate electrode 110, and a first conductive structure 112 are formed over the substrate 102. Further, a dielectric structure 902 is formed along over the substrate 102, where the dielectric structure 902 comprises sidewalls defining an opening 904 that exposes an upper surface of the first conductive structure 112. In some embodiments, forming the gate dielectric layer 108, the gate electrode 110, and the first conductive structure 112 may include: performing one or more deposition and/or growth processes to deposit a gate dielectric film over the substrate 102, deposit a gate electrode layer over the gate dielectric film, and deposit a first conductive layer over the gate electrode layer; and patterning the gate dielectric film, the gate electrode layer, and the first conductive layer, thereby forming the gate dielectric layer 108, the gate electrode 110, and the first conductive structure 112, respectively. In yet further embodiments, the one or more deposition and/or growth processes may, for example, include CVD, PVD, ALD, sputtering, electroless plating, electroplating, another suitable deposition or growth process, or any combination of the foregoing. Subsequently, a process for forming the dielectric structure 902 includes: depositing (e.g., CVD, PVD, ALD, etc.) a dielectric material (e.g., an oxide such as silicon dioxide, or another suitable dielectric material) over the substrate 102 and the first conductive structure 112; forming a masking layer (not shown) over the dielectric material; patterning the dielectric material according to the masking layer, thereby forming the dielectric structure 902 with sidewalls defining the opening 904; and performing a removal process to remove the masking layer.

The gate dielectric layer 108 may, for example, be or comprise an oxide (e.g., silicon dioxide), a high-k dielectric material (e.g., $HfO_2$, $ZrO_2$, or some other dielectric material with a dielectric constant greater than about 3.9), some other dielectric material, or any combination of the foregoing. The gate electrode 110 and/or the first conductive structure 112 may, for example, respectively be or comprise a metal (e.g., aluminum, titanium, tantalum, gold, platinum, tungsten, nickel, iridium, etc.), a metal-nitride (e.g., titanium nitride, tantalum nitride, etc.), a metal-oxide (e.g., iridium oxide), doped polysilicon (e.g., n-type/p-type polysilicon), another suitable conductive material, or any combination of the foregoing.

Figure 10A:
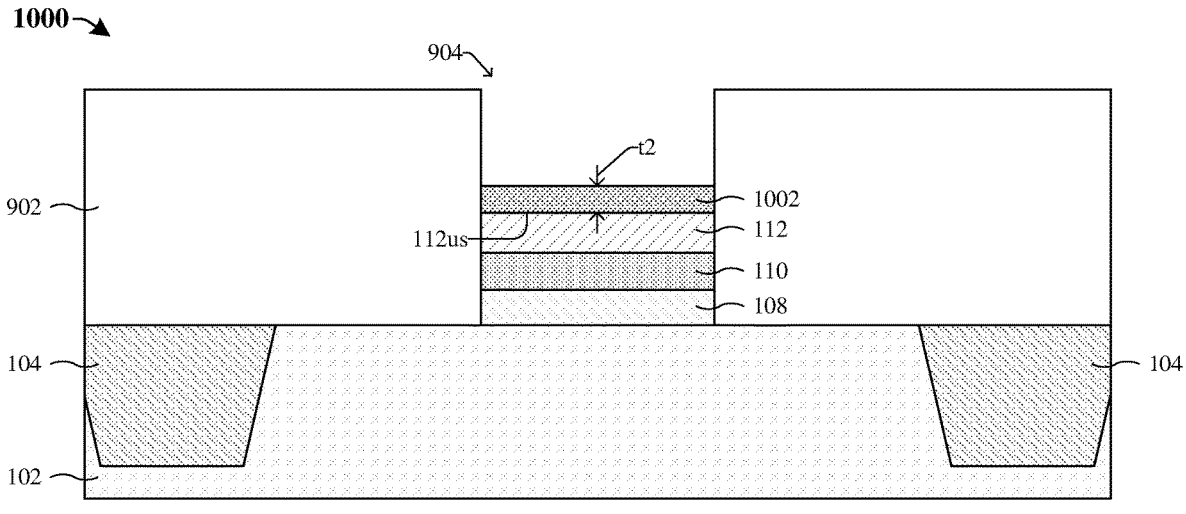

As illustrated in the cross-sectional view 1000 of FIG. 10A, a self-assembled monolayer (SAM) 1002 is selectively deposited on an upper surface 112us of the first conductive structure 112. In some embodiments, the SAM 1002 comprises a head group that adheres or bonds to the first conductive structure 112 but not to the dielectric structure 902. In some embodiments, the SAM 1002 may be deposited onto the first conductive structure 112 by spin coating. In further embodiments, a process for forming the SAM 1002 includes spinning the SAM 1002 onto the structure of FIG. 9, upon being spun onto the structure of FIG. 9 the SAM 1002 will adhere to the first conductive structure 112 but not to the dielectric structure 902.

The SAM 1002 is formed to a thickness t2. In some embodiments, the thickness t2 is, for example, within a range of about 1 to 10 mm, less than about 10 mm, or another suitable value. In some embodiments, if the thickness t2 of the SAM 1002 is relatively small (e.g., less than about 1 mm), then the SAM 1002 may not properly block deposition of a sidewall spacer layer (e.g., 1102 of FIG. 11) over a center region of the first conductive structure 112 in subsequent processing steps. In further embodiments, if the thickness t2 of the SAM 1002 is substantially thick (e.g., greater than about 10 mm), then a minimum thickness of a ferroelectric layer (116 of FIG. 14A), formed over the first conductive structure 112, would be increased, thereby increasing a voltage value applied across the ferroelectric layer to induce switching. This, in part, may increase a power consumption and decrease an overall performance of a ferroelectric memory device (114 of FIG. 15).

Figure 10B:
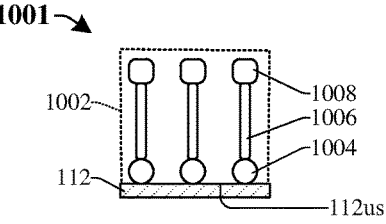
Figure 10B:
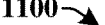

As illustrated in the cross-sectional view 1001 of FIG. 10B, in some embodiments, the SAM 1002 is formed over the first conductive structure 112 in such a manner that the SAM 1002 comprises a head group 1004 connected to a terminal group 1008 (i.e., function group) by way of a molecular chain 1006 (i.e., tail). The head group 1004 has a hydrophilic interfacial property that causes the SAM 1002 to be attracted the first conductive structure 112. In some embodiments, the head group 1004 may comprise sulfhydryl, thiol, or a nitride, which provide the hydrophilic interfacial property. In further embodiments, the molecular chain 1006 may, for example, comprise an alkyl chain, such as methylene $(CH_2)_n$. The terminal group 1008 has a hydrophobic interfacial property that repels one or more compounds (e.g., water), thereby preventing specific materials (e.g., a metal oxide) from adhering to the SAM 1002. In some embodiments, the terminal group 1008 may comprise a methyl group (e.g., $CH_3$), which provides the hydrophobic interfacial property.

Figure 11:
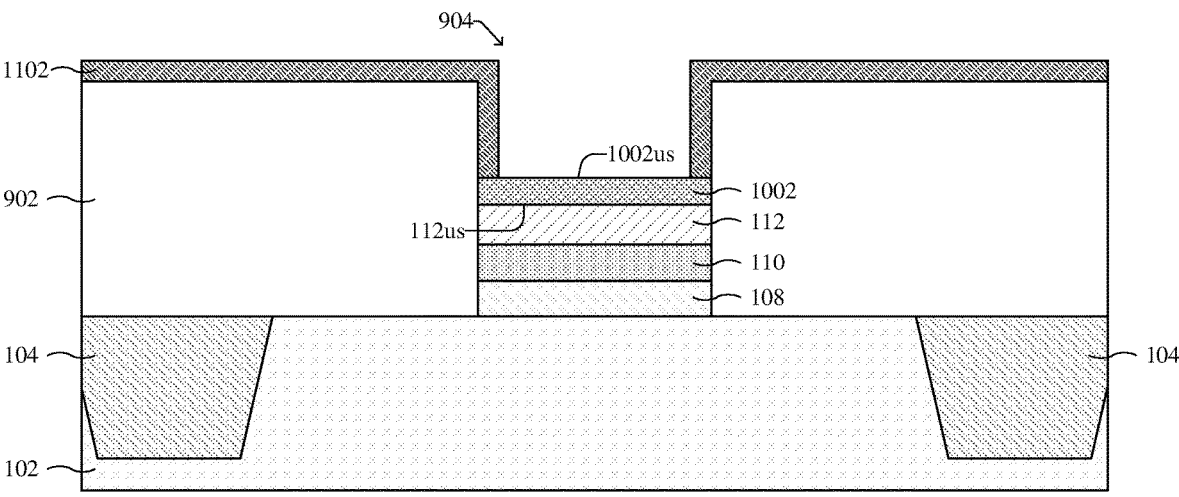

As illustrated in the cross-sectional view 1100 of FIG. 11, a sidewall spacer layer 1102 is deposited along an upper surface of the dielectric structure 902 and along sidewalls of the dielectric structure 902 that define the opening 904. In some embodiments, the sidewall spacer layer 1102 may, for example, be or comprise a metallic or metal oxide, such as aluminum oxide, another suitable metal oxide, another suitable dielectric material, or the like. In further embodiments, the sidewall spacer layer 1102 may be formed as a conformal layer over the dielectric structure 902. In such embodiments, the sidewall spacer layer 1102 may be deposited by, for example, CVD, ALD, or another suitable deposition or growth process. In some embodiments, the terminal group (1008 of FIG. 10B) of the SAM 1002 comprises the hydrophobic surface which prevents the sidewall spacer layer 1102 (e.g., aluminum oxide) from adhering and/or bonding to the SAM 1002. Thus, in some embodiments, the SAM 1002 is configured to prevent and/or block deposition of the sidewall spacer layer 1102 on the upper surface 1002us of the SAM 1002 such that the sidewall spacer layer 1102 may be selectively deposited in areas in which the SAM 1002 is not located.

Figure 12:
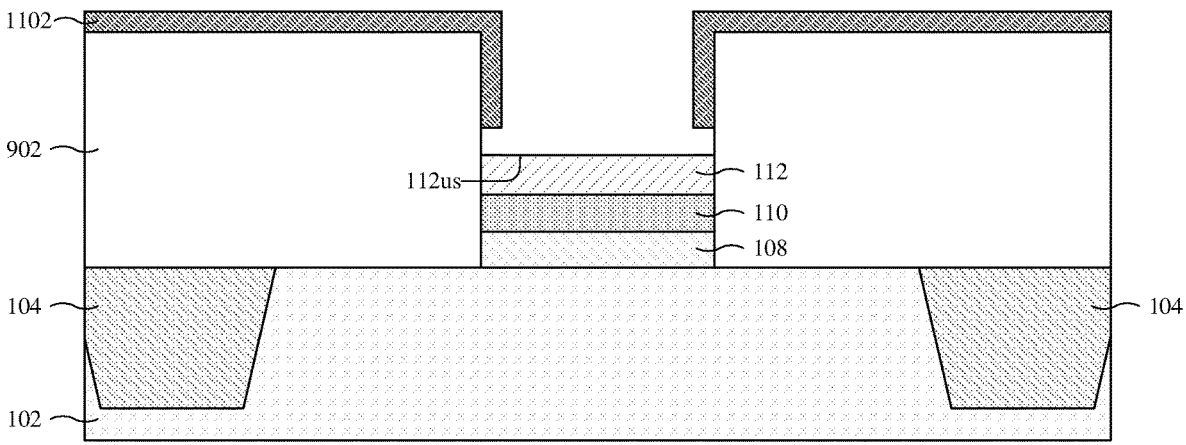

As illustrated in the cross-sectional view 1200 of FIG. 12, a removal process is performed to remove the SAM (1002 of FIG. 11) from the upper surface 112us of the first conductive structure 112. In some embodiments, the removal process includes exposing the structure of FIG. 11 to a removal plasma (e.g., hydrogen $(H_2)$) that is configured to remove the SAM (1002 of FIG. 11).

Figure 13:
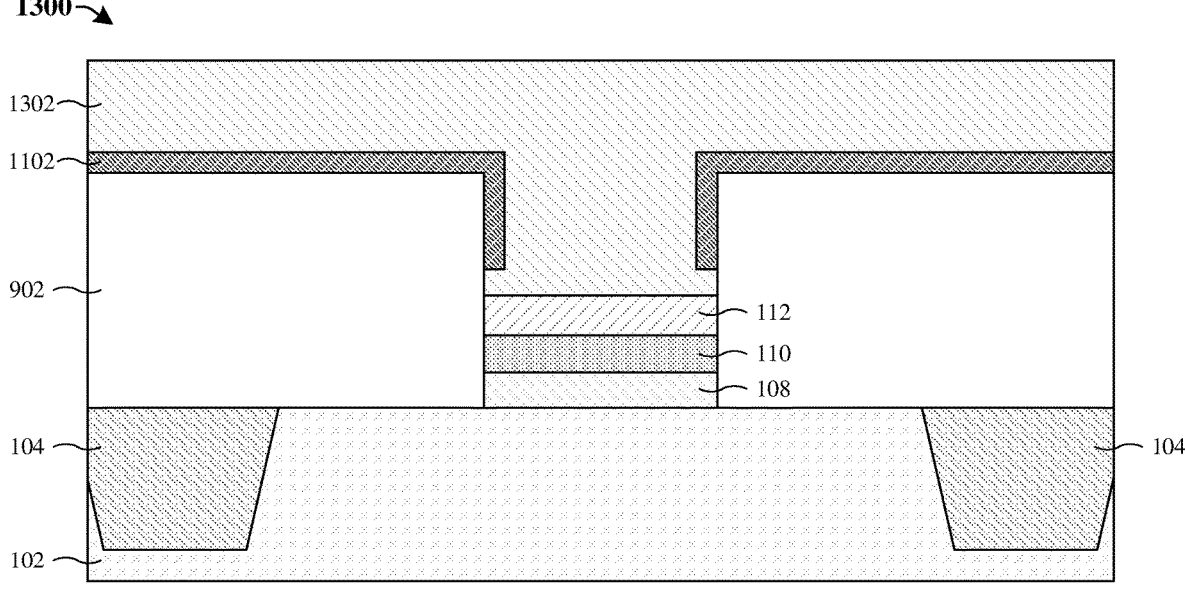

As illustrated in the cross-sectional view 1300 of FIG. 13, a ferroelectric film 1302 is deposited over the sidewall spacer layer 1102 and the first conductive structure 112. The ferroelectric film 1302 may be deposited over the substrate 102 as a conformal layer. In such embodiments, the ferroelectric film 1302 may be deposited by CVD, PVD, ALD, or another suitable deposition or growth process. In further embodiments, the ferroelectric film 1302 may, for example, be or comprise a metal-oxide (e.g., hafnium oxide ($Hf_xO_Y$)), a component-metal-oxide (e.g., hafnium-silicon-oxide ($Hf_xSi_YO_Z$), hafnium-aluminum-oxide ($Hf_xAl_YO_Z$), hafnium-gadolinium-oxide ($Hf_xGd_YO_Z$), hafnium-zirconium-oxide ($Hf_xZr_YO_Z$), hafnium-lanthanum-oxide ($Hf_xLa_YO_Z$), hafnium-strontium-oxide ($Hf_xSr_YO_Z$), hafnium-yttrium-oxide ($Hf_xY_YO_Z$), etc.), a metal-oxynitride (e.g., hafnium oxynitride ($Hf_xO_YN_Z$)), or the like.

Figure 14A:
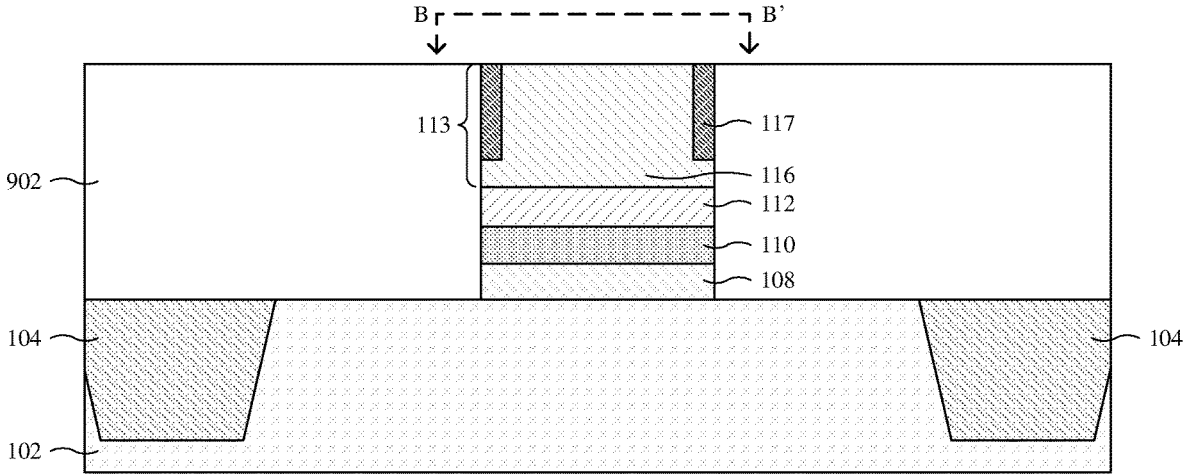
Figure 14B:
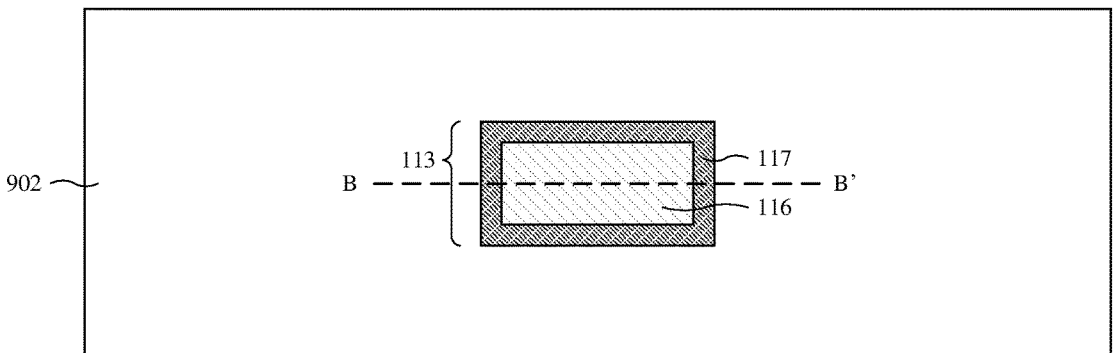

With reference to FIGS. 14A-14B, FIG. 14A illustrates a cross-sectional view 1400a of the integrated chip during various formation processes, and FIG. 14B illustrates a top view 1400b taken along the line B-B' of FIG. 14A.

As illustrated in the cross-sectional view 1400a of FIG. 14A and the top view 1400b of FIG. 14B, a planarization process (e.g., a chemical mechanical planarization (CMP) process) is performed into the sidewall spacer layer (1102 of FIG. 13) and the ferroelectric film (1302 of FIG. 13) until a top surface of the dielectric structure 902 is reached, thereby forming a sidewall spacer structure 117 and a ferroelectric layer 116, respectively. This, in part, forms a ferroelectric structure 113. FIG. 14B illustrates the top view 1400b of some embodiments of the cross-sectional view 1400a of FIG. 14A taken along the line B-B'. After performing the planarization process, a top surface of the ferroelectric layer 116, a top surface of the sidewall spacer structure 117, and the top surface of the dielectric structure 902 are substantially co-planar with one another. As illustrated in the top view 1400b of FIG. 14B, the sidewall spacer structure 117 laterally encloses the ferroelectric layer 116.

Figure 15:
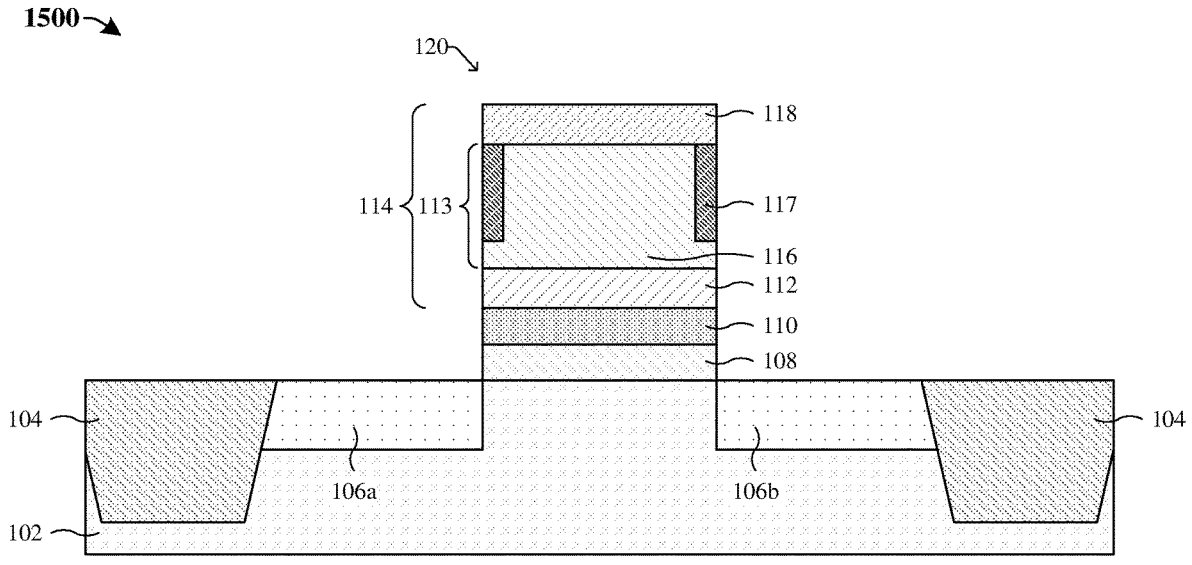

As illustrated in the cross-sectional view 1500 of FIG. 15, a second conductive structure 118 is formed over the ferroelectric structure 113, thereby forming a ferroelectric memory device 114 and a device gate stack 120. In some embodiments, a process for forming the second conductive structure 118 includes: depositing (e.g., by CVD, PVD, sputtering, electroless plating, electro plating, or another suitable deposition or growth process) a conductive layer over the substrate 102; and pattering the conductive layer, thereby defining the second conductive structure 118. In some embodiments, the second conductive structure 118 may, for example, be or comprise a metal (e.g., aluminum, titanium, tantalum, gold, platinum, tungsten, nickel, iridium, etc.), a metal-nitride (e.g., titanium nitride, tantalum nitride, etc.), doped polysilicon (e.g., n-type/p-type polysilicon), another suitable conductive material, or any combination of the foregoing. Further, a removal process may be performed to remove the dielectric structure (902 of FIGS. 14A-14B) from over the substrate 102.

In addition, as illustrated in FIG. 15, a pair of source/drain regions 106*a-b* are formed in the substrate 102. The source/drain regions 106*a-b* are formed on opposite sides of the gate dielectric layer 108. In some embodiments, the source/drain regions 106*a-b* are formed by an ion implantation process and may utilize a masking layer (not shown) to selectively implant ions into the substrate 102. In further embodiments, the device gate stack 120 may be utilized as the masking layer to form the source/drain regions 106*a-b*.

Figure 16:
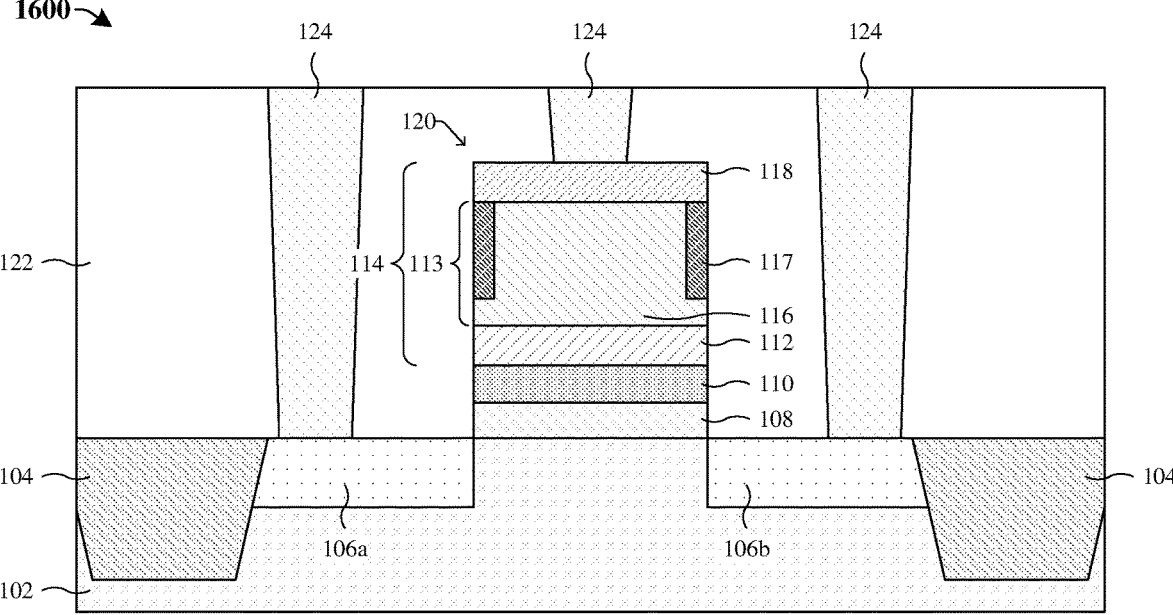

As illustrated in the cross-sectional view 1600 of FIG. 16, an inter-level dielectric (ILD) structure 122 is formed over the substrate 102. In some embodiments, the ILD structure 122 may be formed by, for example, CVD, PVD, ALD, or another suitable deposition or growth process. Further, a plurality of conductive contacts 124 are formed over the substrate 102 and within the ILD structure 122. In some embodiments, the conductive contacts 124 may be formed by a single damascene process or another suitable process. In further embodiments, the ILD structure 122 may, for example, be or comprise an oxide (e.g., silicon dioxide), a low-k dielectric material, an extreme low-k dielectric material, another suitable dielectric material, or any combination of the foregoing. In further embodiments, the conductive contacts 124 may, for example, be or comprise aluminum, copper, tungsten, titanium nitride, tantalum nitride, another suitable conductive material, or any combination of the foregoing.

FIGS. 17-22 illustrate cross-sectional views 1700-2200 of some embodiments of a second method of forming an integrated chip having a ferroelectric memory device with a sidewall spacer structure laterally surrounding a ferroelectric layer according to aspects of the present disclosure. Although the cross-sectional views 1700-2200 shown in FIGS. 17-22 are described with reference to a second method, it will be appreciated that the structures shown in FIGS. 17-22 are not limited to the second method but rather may stand alone separate of the second method. Furthermore, although FIGS. 17-22 are described as a series of acts, it will be appreciated that these acts are not limiting in that the order of the acts can be altered in other embodiments, some acts that are illustrated and/or described may be omitted in whole or in part.

Figure 17:
FIGS. 17-22 illustrate a series of various views of some embodiments of a second method for forming an integrated chip having a ferroelectric memory device with a sidewall spacer structure laterally enclosing a ferroelectric layer.
Figure 17:
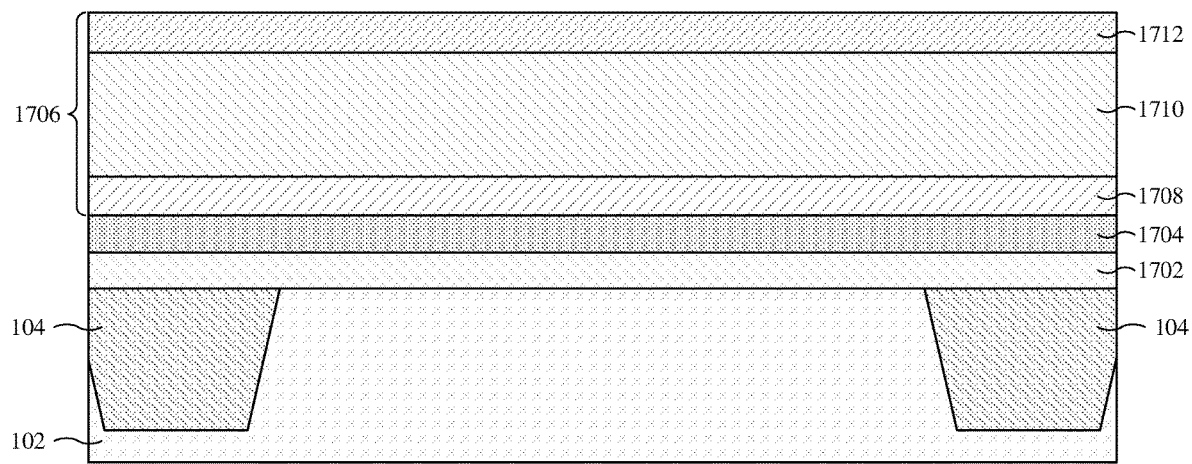

As illustrated in the cross-sectional view 1700 of FIG. 17, an isolation structure 104 is formed in a substrate 102. Further, a gate dielectric film 1702 is formed over the substrate 102, and a gate electrode layer 1704 is formed over the gate dielectric film 1702. Subsequently, a stack of memory layers 1706 is formed over the gate electrode layer 1704. In some embodiments, the isolation structure 104 may be formed as illustrated and/or described in the cross-sectional view 800 of FIG. 8. In further embodiments, forming the stack of memory layers 1706 includes performing one or more deposition and/or growth processes to define a first conductive layer 1708, a ferroelectric film 1710, and a second conductive layer 1712. In yet further embodiments, the one or more deposition and/or growth processes may, for example, include CVD, PVD, ALD, sputtering, electroless plating, electroplating, another suitable deposition or growth process, or any combination of the foregoing. For example, forming the stack of memory layers 1706 may include: depositing the first conductive layer 1708 over the gate electrode layer 1704, depositing the ferroelectric film 1710 over the first conductive layer 1708, and depositing the second conductive layer 1712 over the ferroelectric film 1710.

Further, the gate dielectric film 1702 may, for example, be deposited by CVD, PVD, ALD, or another suitable growth or deposition process. Furthermore, the gate electrode layer 1704 may, for example, be deposited by CVD, PVD, sputtering, electroless plating, electroplating, or another suitable deposition or growth process.

Figure 18:
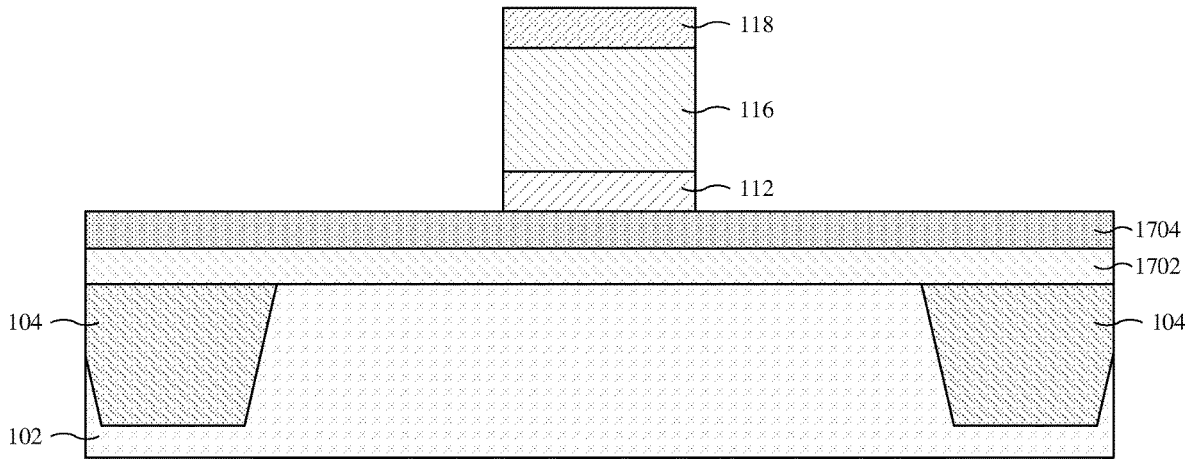

As illustrated in the cross-sectional view 1800 of FIG. 18, a patterning process is performed on the stack of memory layers (1706 of FIG. 17) to form a first conductive structure 112, a ferroelectric layer 116, and a second conductive structure 118. In some embodiments, the patterning process includes: forming a masking layer (not shown) over the second conductive layer (1712 of FIG. 17); exposing unmasked regions of the stack of memory layers (1706 of FIG. 17) to one or more etchants, thereby forming the first and second conductive structures 112, 118, and the ferroelectric layer 116; and performing a removal process to remove the masking layer. In further embodiments, performing the patterning process includes performing a wet etch process and/or a dry etch process.

Figure 19:
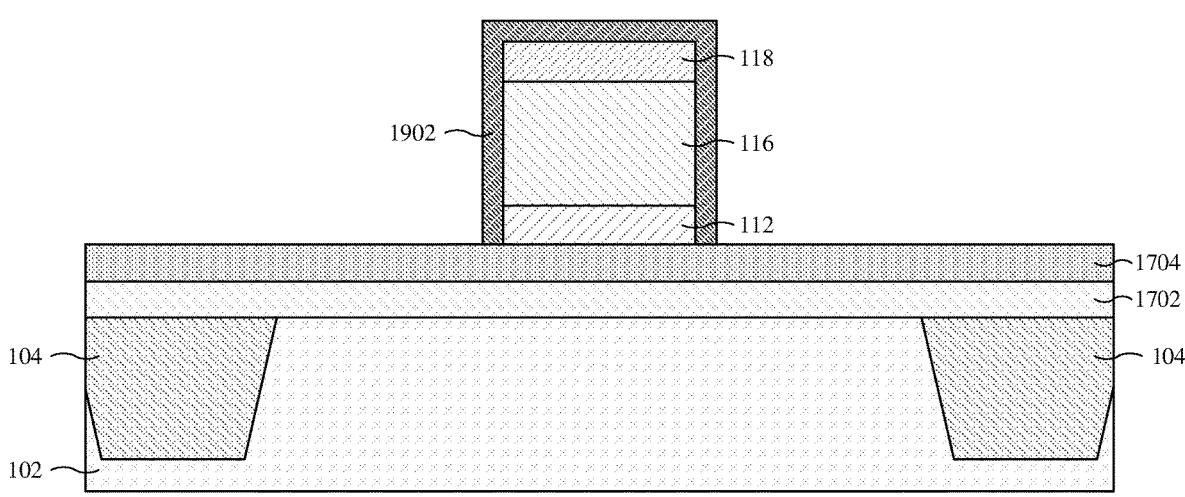

As illustrated in the cross-sectional view 1900 of FIG. 19, a sidewall spacer layer 1902 is formed over the second conductive structure 118, such that the sidewall spacer layer 1902 laterally encloses sidewalls of the first and second conductive structures 112, 118 and sidewalls of the ferroelectric layer 116. In some embodiments, the sidewall spacer layer 1902 may be deposited (e.g., by PVD, CVD, ALD, etc.) as a conformal layer over the second conductive structure 118 and the gate electrode layer 1704. Subsequently, in further embodiments, a patterning process may be performed on the sidewall spacer layer 1902 to remove it from regions of the gate electrode layer 1704 laterally offset from sidewalls of the first conductive structure 112. In some embodiments, the sidewall spacer layer 1902 may, for example, be or comprise a metallic or metal oxide, such as aluminum oxide, another suitable metal oxide, another suitable dielectric material, or the like.

Figure 20:
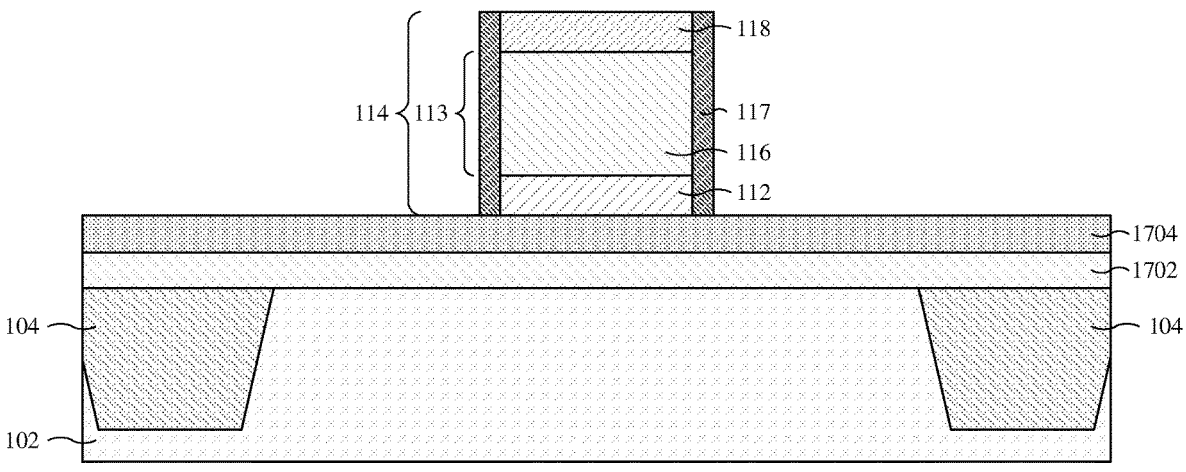

As illustrated in the cross-sectional view 2000 of FIG. 20, a planarization process (e.g., a CMP process) is performed into the sidewall spacer layer (1902 of FIG. 19) until an upper surface of the second conductive structure 118 is reached, thereby forming a ferroelectric structure 113 and a ferroelectric memory device 114.

Figure 21:
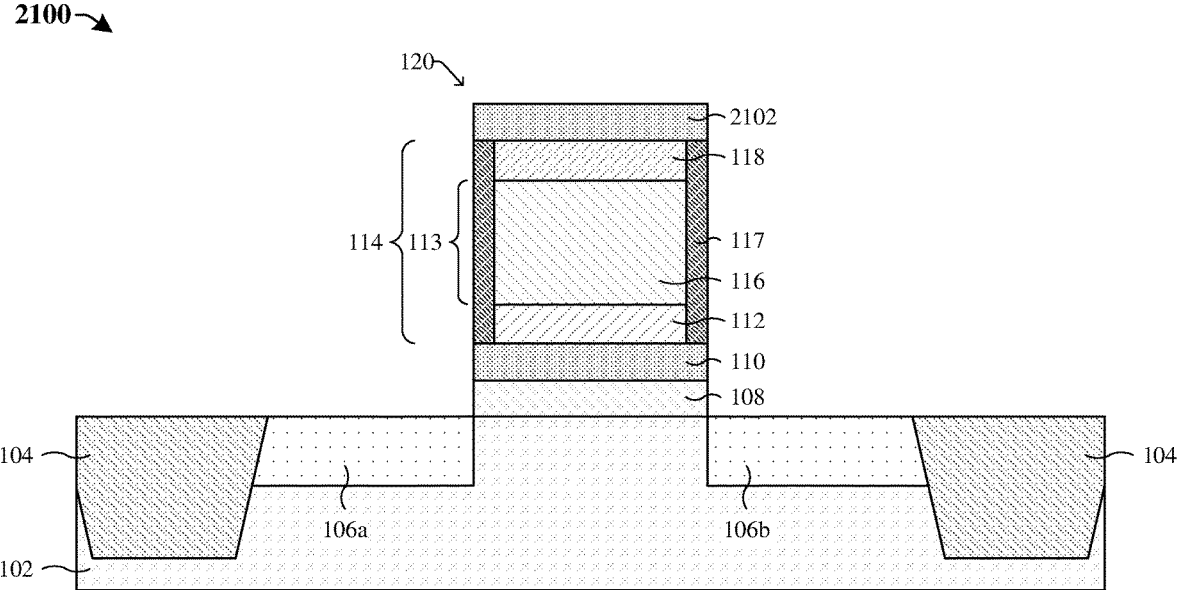

As illustrated in the cross-sectional view 2100 of FIG. 21, a top electrode 2102 is formed over the ferroelectric memory device 114, thereby forming a device gate stack 120. In some embodiments, a process for forming the top electrode 2102 includes: depositing (e.g., by CVD, PVD, sputtering, electroless plating, electro plating, or another suitable deposition or growth process) a conductive layer over the substrate 102; and patterning the conductive layer, thereby forming the top electrode 2102. In some embodiments, the top electrode 2102 may, for example, be or comprise aluminum, tungsten, copper titanium, tantalum, platinum, titanium nitride, tantalum nitride, doped polysilicon, another suitable conductive material, or any combination of the foregoing.

Further, a pair of source/drain regions 106*a-b* are formed in the substrate 102. In some embodiments, the source/drain regions 106*a-b* may be formed as illustrated and/or described in the cross-sectional view 1500 of FIG. 15.

Figure 22:
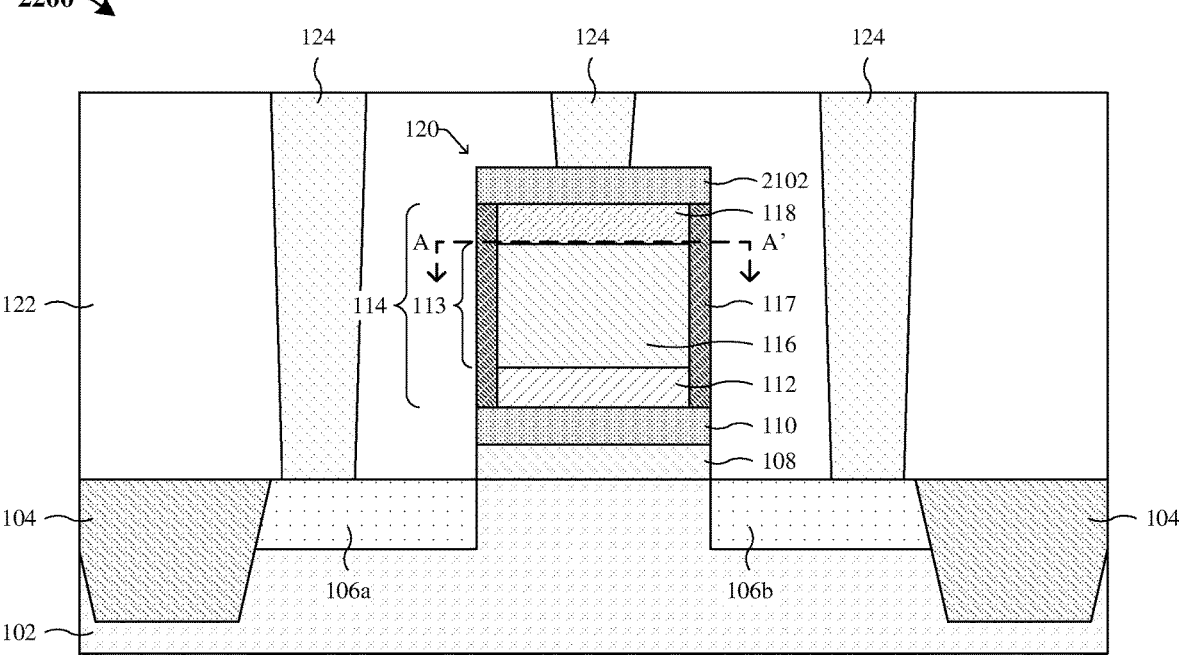

As illustrated in the cross-sectional view 2200 of FIG. 22, an inter-level dielectric (ILD) structure 122 is formed over the substrate 102, and a plurality of conductive contacts 124 are formed over the substrate 102 and within the ILD structure 122. In some embodiments, the ILD structure 122 and the plurality of conductive contacts 124 may be formed as illustrated and/or described in the cross-sectional view 1600 of FIG. 16.

FIG. 23 illustrates a flowchart 2300 of some embodiments of a method for forming an integrated chip comprising a front-end-of-line ferroelectric memory device having a sidewall spacer structure laterally enclosing a ferroelectric layer in accordance with some embodiments of the present disclosure. Although the flowchart 2300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2302, an isolation structure is formed within the substrate. FIGS. 8 and 17 illustrate cross-sectional views 800 and 1700 corresponding to some alternative embodiments of act 2302.

At act 2304a, a gate dielectric is formed over the substrate, and a first conductive structure is formed over the gate dielectric layer. FIG. 9 illustrates a cross-sectional view 900 corresponding to some embodiments of act 2304a.

At act 2304b, a dielectric structure is formed around the first conductive structure, such that the dielectric structure comprises sidewalls defining an opening over the first conductive structure. FIG. 9 illustrates a cross-sectional view 900 corresponding to some embodiments of act 2304b.

At act 2304c, a self-assembled monolayer (SAM) is selectively deposited over the first conductive structure. FIG. 10A illustrates a cross-sectional view 1000 corresponding to some embodiments of act 2304c.

At act 2304d, a sidewall spacer layer is selectively deposited over the dielectric structure, where the sidewall spacer layer is deposited in areas in which the SAM is not located. FIG. 11 illustrates a cross-sectional view 1100 corresponding to some embodiments of act 2304d.

At act 2304e, a ferroelectric film is deposited over the sidewall spacer layer and within the opening. FIG. 13 illustrates a cross-sectional view 1300 corresponding to some embodiments of act 2304e.

At act 2304f, a planarization process is performed into the ferroelectric film and the sidewall spacer layer, thereby forming a ferroelectric layer and a sidewall spacer structure, respectively. FIGS. 14A-14B illustrate various views corresponding to some embodiments of act 2304f.

At act 2306a, a gate dielectric layer is formed over the substrate. FIG. 17 illustrates a cross-sectional view 1700 corresponding to some embodiments of act 2306a.

At act 2306b, a stack of memory layers is formed over the gate dielectric layer, where the stack of memory layers includes a ferroelectric film disposed between first and second conductive layers. FIG. 17 illustrates a cross-sectional view 1700 corresponding to some embodiments of act 2306b.

At act 2306c, the stack of memory layers is patterned, thereby forming a ferroelectric layer between a first conductive structure and a second conductive structure. FIG. 18 illustrates a cross-sectional view 1800 corresponding to some embodiments of act 2306c.

At act 2306d, a sidewall spacer layer is deposited over the second conductive structure, such that the sidewall spacer layer laterally encloses the first and second conductive structures and the ferroelectric layer. FIG. 19 illustrates a cross-sectional view 1900 corresponding to some embodiments of act 2306d.

At act 2306e, a planarization process is performed into the sidewall spacer layer, thereby forming a sidewall spacer structure. FIG. 20 illustrates a cross-sectional view 2000 corresponding to some embodiments of act 2306e.

At act 2308, a pair of source/drain regions are formed in the substrate and on opposite sides of the gate dielectric layer. FIGS. 15 and 21 illustrates cross-sectional views 1500 and 2100 corresponding to some alternative embodiments of act 2308.

At act 2310, an inter-level dielectric (ILD) structure is formed over the substrate, and a plurality of conductive contacts are formed in the ILD structure. FIGS. 16 and 22 illustrate cross-sectional views 1600 and 2200 corresponding to some alternative embodiments of act 2310.

FIG. 24 illustrates a flowchart 2400 of some embodiments of a method for forming an integrated chip comprising a back-end-of-line ferroelectric memory device having a sidewall spacer structure laterally enclosing a ferroelectric layer in accordance with some embodiments of the present disclosure. In some embodiments, the back-end-of-line ferroelectric memory device may be the upper ferroelectric memory device 703 of FIGS. 7A-7B. Although the flowchart 2400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2402, a front-end-of-line semiconductor device is formed on a substrate.

In some embodiments, the front-end-of-line semiconductor device may, for example, be a metal-oxide semiconductor field-effect transistor (MOSFET), a bipolar junction transistor (BJT), high-electron-mobility transistor (HEMT), or any other front-end-of-line semiconductor device. In some embodiments, the front-end-of-line semiconductor device may be formed by process(es) substantially similar to process(es) described above regarding formation of the structure of the cross-sectional view 1600 of FIG. 16 (see, e.g., FIGS. 8-16). For example, the process(es) to form the isolation structure 104, the gate dielectric layer 108, the gate electrode 110, and/or the source/drain regions 106a-b.

At act 2404, a first portion of an interconnect structure is formed over the front-end-of-line semiconductor device and the substrate, where the first portion of the interconnect structure comprises a first plurality of conductive features disposed in a lower inter-level dielectric (ILD) structure.

In some embodiments, the first plurality of conductive features may be substantially similar to one or more of the plurality of conductive contacts 124, the plurality of conductive lines 502, and/or the plurality of conductive vias 504 disposed in the lower ILD structure 702 (e.g., see FIG. 7A). In further embodiments, the lower ILD structure may be substantially similar to the lower ILD structure 702 of FIG. 7A. In yet further embodiments, the lower ILD structure may be deposited by CVD, PVD, ALD, or another suitable growth or deposition process. In various embodiments, the first plurality of conductive features may be formed by a single damascene process or a dual damascene process.

At act 2406, an upper ferroelectric memory device comprising a ferroelectric structure between a first conductive structure and a second conductive structure is formed over the first portion of the interconnect structure. The ferroelectric structure comprises a sidewall spacer structure laterally enclosing a ferroelectric layer. Further, the first portion of the interconnect structure electrically couples the ferroelectric memory device to the front-end-of-line semiconductor device.

In some embodiments, the upper ferroelectric memory device may be formed over the first portion of the interconnect structure by process(es) substantially similar to process(es) described above regarding formation of the ferroelectric memory device 114 (see, e.g., FIGS. 9-15 and/or FIGS. 18-20). For example, the process(es) to form the first conductive structure 112, the ferroelectric structure 113, and/or the second conductive structure 118.

At act 2408, a middle ILD structure is formed over the first portion of the interconnect structure and around the upper ferroelectric memory device.

In some embodiments, the middle ILD structure may be substantially similar to the middle ILD structure 704 of FIG. 7A. In further embodiments, the middle ILD structure may be deposited by CVD, PVD, ALD, or another suitable growth or deposition process.

At act 2410, a second portion of the interconnect structure is formed over the middle ILD structure and the upper ferroelectric memory device. The second portion of the interconnect structure comprises a second plurality of conductive features disposed in an upper ILD structure.

In some embodiments, the second plurality of conductive features may be substantially similar to one or more of the plurality of conductive lines 502 and/or the plurality of conductive vias 504 disposed in the upper ILD structure 706 (e.g., see FIG. 7A). In further embodiments, the upper ILD structure may be substantially similar to the upper ILD structure 706 of FIG. 7A. In yet further embodiments, the upper ILD structure may be deposited by CVD, PVD, ALD, or another suitable growth or deposition process. In various embodiments, the second plurality of conductive features may be formed by a single damascene process or a dual damascene process.

Accordingly, in some embodiments, the present disclosure relates to a ferroelectric memory device that comprises a ferroelectric structure disposed between a first conductive structure and a second conductive structure. The ferroelectric structure comprises a sidewall spacer structure laterally enclosing a ferroelectric layer, where the sidewall spacer structure is configured to increase a switching performance of the ferroelectric memory device.

In some embodiments, the present application provides an integrated chip, including: a pair of source/drain regions disposed in a substrate; a gate dielectric layer disposed over the substrate and laterally between the pair of source/drain regions; and a ferroelectric structure overlying the gate dielectric layer, wherein the ferroelectric structure includes a ferroelectric layer and a sidewall spacer structure, wherein the sidewall spacer structure continuously laterally wraps around the ferroelectric layer, and wherein the ferroelectric layer comprises a first metal oxide and the sidewall spacer structure comprises a second metal oxide different than the first metal oxide.

In further embodiments, the present application provides an integrated chip, including: a semiconductor device disposed on a substrate; a first inter-level dielectric (ILD) structure overlying the semiconductor device and the substrate; and a polarization switching structure overlying the first ILD structure and electrically coupled to the semiconductor device, wherein the polarization switching structure includes a ferroelectric structure disposed between a first conductive structure and a second conductive structure, wherein the ferroelectric structure includes a ferroelectric layer and a sidewall spacer structure, wherein the sidewall spacer structure laterally encloses the ferroelectric layer, and wherein a dielectric constant of the ferroelectric layer is greater than a dielectric constant of the sidewall spacer structure.

In yet further embodiments, the present application provides a method for forming a ferroelectric memory device, the method includes: forming a first conductive structure over a substrate; forming a dielectric structure over the substrate such that the dielectric structure comprises sidewalls defining an opening that exposes an upper surface of the first conductive structure; selectively depositing a self-assembled monolayer (SAM) along the upper surface of the first conductive structure; selectively depositing a sidewall spacer layer along the sidewalls of the dielectric structure and an upper surface of the dielectric structure, wherein the SAM is configured to block deposition of the sidewall spacer layer along an upper surface of the SAM; performing a removal process to remove the SAM from the upper surface of the first conductive structure; depositing a ferroelectric film over the first conductive structure and the sidewall spacer layer; performing a planarization process into the ferroelectric film and the sidewall spacer layer, thereby forming a ferroelectric layer and a sidewall spacer structure, respectively; and forming a second conductive structure over the ferroelectric layer and the sidewall spacer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a switching layer overlying a semiconductor substrate, wherein the switching layer comprises a first metal oxide;
an upper conductive structure overlying the switching layer, wherein the switching layer is spaced between opposing sidewalls of the upper conductive structure;
a first dielectric layer disposed along and directly contacting first opposing sidewalls of the switching layer, wherein the first dielectric layer comprises a second metal oxide different from the first metal oxide, wherein a top surface of the switching layer and a top surface of the first dielectric layer are aligned and directly underlie a single planar bottommost surface of the upper conductive structure, and wherein a dielectric constant of the switching layer is greater than a dielectric constant of the first dielectric layer; and a dielectric structure overlying the upper conductive structure and contacting the first dielectric layer, wherein a dielectric constant of the dielectric structure is less than the dielectric constant of the first dielectric layer.

2. The integrated chip of claim 1, wherein the first dielectric layer comprises a switching enhancement element disposed along the first opposing sidewalls of the switching layer, wherein the switching enhancement element is laterally offset from a middle region of the switching layer by a non-zero distance.

3. The integrated chip of claim 1, wherein the switching layer comprises an outer segment directly under a bottom surface of the first dielectric layer.

4. The integrated chip of claim 1, wherein a ratio of a width of the switching layer and a lateral thickness of the first dielectric layer along the first opposing sidewalls of the switching layer is within a range of about 5:1 to 30:1.

5. The integrated chip of claim 1, wherein a width of the switching layer is less than a width of the upper conductive structure, and wherein a height of the switching layer is greater than a height of the upper conductive structure.

6. The integrated chip of claim 1, wherein the first metal oxide is a ferroelectric material.

7. The integrated chip of claim 1, further comprising:
a second dielectric layer disposed between the switching layer and the semiconductor substrate, wherein outer sidewalls of the second dielectric layer are aligned with outer sidewalls of the first dielectric layer.

8. The integrated chip of claim 1, wherein the switching layer comprises second opposing sidewalls, wherein the first opposing sidewalls are spaced between the second opposing sidewalls, and wherein the second opposing sidewalls are aligned with outer opposing sidewalls of the first dielectric layer.

9. The integrated chip of claim 1, wherein the dielectric structure contacts the switching layer.

10. An integrated chip, comprising:
a first conductive structure overlying a semiconductor substrate;
a second conductive structure overlying the first conductive structure; and
a switching structure disposed between the first conductive structure and the second conductive structure, wherein the switching structure comprises a switching layer and a first dielectric layer laterally enclosing the switching layer, wherein a sidewall of the switching structure is aligned with a sidewall of the second conductive structure, wherein the switching layer comprises a lateral surface vertically above a bottom surface of the switching layer, wherein a bottom surface of the first dielectric layer contacts the lateral surface.

11. The integrated chip of claim 10, wherein the sidewall of the switching structure is defined by an outer sidewall of the first dielectric layer.

12. The integrated chip of claim 10, further comprising:
a gate dielectric layer disposed between the first conductive structure and the semiconductor substrate; and
a pair of source/drain regions disposed within the semiconductor substrate on opposing sides of the first conductive structure.

13. The integrated chip of claim 10, wherein the switching layer comprises a dielectric material different from that of the first dielectric layer.

14. The integrated chip of claim 13, wherein the switching layer and the first dielectric layer physically contact a bottom surface of the second conductive structure.

15. The integrated chip of claim 10, wherein a width of the switching layer is within a range of about 20 to 150 nanometers, wherein a lateral thickness of the first dielectric layer along the switching layer is within a range of about 0.2 to 100 angstroms.

16. An integrated chip, comprising:
a switching layer overlying a semiconductor substrate;
an upper conductive structure over the switching layer; and
a sidewall spacer layer arranged directly on opposing sidewalls of the switching layer, wherein a bottommost surface of the sidewall spacer layer is vertically offset from a bottom surface of the switching layer in a direction away from the semiconductor substrate.

17. The integrated chip of claim 16, wherein the bottommost surface of the sidewall spacer layer contacts a lateral surface of the switching layer.

18. The integrated chip of claim 16, wherein a top surface of the sidewall spacer layer contacts a bottom surface of the upper conductive structure, and wherein outer sidewalls of the sidewall spacer layer are aligned with outer sidewalls of the upper conductive structure.

19. The integrated chip of claim 16, wherein the switching layer comprises a ferroelectric material, and wherein the sidewall spacer layer physically contacts the opposing sidewalls of the switching layer.

20. The integrated chip of claim 16, further comprising:
a lower conductive structure on the bottom surface of the switching layer; and
a conductive interconnect structure on the upper conductive structure.

* * * * *